(12) United States Patent
Jeong et al.

(10) Patent No.: US 11,169,915 B2
(45) Date of Patent: Nov. 9, 2021

(54) MEMORY SYSTEMS HAVING SUPPRESSED READ DISTURBANCE AND IMPROVED ERROR CORRECTION CAPABILITY

(71) Applicant: SK hynix Inc., Icheon-si (KR)

(72) Inventors: Seung Gyu Jeong, Gwangmyeong-si (KR); Won Gyu Shin, Seoul (KR)

(73) Assignee: SK hynix Inc., Icheon-si (KR)

(*) Notice: Subject to any disclaimer, the term of this patent is extended or adjusted under 35 U.S.C. 154(b) by 74 days.

(21) Appl. No.: 16/821,822

(22) Filed: Mar. 17, 2020

(65) Prior Publication Data

US 2021/0004321 A1    Jan. 7, 2021

(30) Foreign Application Priority Data

Jul. 3, 2019 (KR) ............... 10-2019-0080189

(51) Int. Cl.
*G06F 12/02* (2006.01)

(52) U.S. Cl.
CPC .. *G06F 12/0207* (2013.01); *G06F 2212/1032* (2013.01)

(58) Field of Classification Search
None
See application file for complete search history.

(56) References Cited

U.S. PATENT DOCUMENTS

| | | | | |
|---|---|---|---|---|
| 5,771,194 A | * | 6/1998 | Maeno | G11C 7/1006 365/200 |
| 5,950,224 A | * | 9/1999 | Devin | G11C 11/5621 711/106 |
| 9,973,212 B2 | * | 5/2018 | Hung | H03M 13/3776 |
| 2009/0097348 A1 | * | 4/2009 | Minzoni | G11C 11/4096 365/230.03 |
| 2014/0025880 A1 | * | 1/2014 | Yu | G11C 11/403 711/105 |
| 2015/0255155 A1 | * | 9/2015 | Antonakopoulos | G11C 13/0069 365/163 |
| 2019/0044537 A1 | * | 2/2019 | Reynwar | H03M 13/1117 |

FOREIGN PATENT DOCUMENTS

| KR | 1020150113303 A | 10/2015 |
|---|---|---|
| KR | 1020180083023 A | 7/2018 |

* cited by examiner

*Primary Examiner* — Yaima Rigol
(74) *Attorney, Agent, or Firm* — William Park & Associates Ltd.

(57) ABSTRACT

A memory system includes a memory medium including a plurality of matrices and a plurality of data input/output (I/O) terminals, a row address adding circuit configured to add row address additive values to an input row address for accessing memory cells of the plurality of matrices, and a column address adding circuit configured to add column address additive values to an input column address for accessing to memory cells of the plurality of matrices. The plurality of matrices are configured into a plurality of matrix sub-groups, wherein each matrix sub-group includes matrices accessed through the same data I/O terminal. The row address additive values are different from each other according to the matrix sub-groups, and the column address additive values are different from each other according to the matrix sub-groups.

20 Claims, 25 Drawing Sheets

| MAT sub-group | SG0 | SG1 | SG2 | SG3 | SG4 | SG5 | SG6 | SG7 |
|---|---|---|---|---|---|---|---|---|
| MAT No. (CHIP0) | 0-7 | 8-15 | 16-23 | 24-31 | 32-39 | 40-47 | 48-55 | 56-63 |
| | 120-127 | 112-119 | 104-111 | 96-103 | 88-95 | 80-87 | 72-79 | 64-71 |

| MAT sub-group | SG8 | SG9 | SG10 | SG11 | SG12 | SG13 | SG14 | SG15 |
|---|---|---|---|---|---|---|---|---|
| MAT No. (CHIP1) | 128-135 | 136-143 | 144-151 | 152-159 | 160-167 | 168-175 | 176-183 | 184-191 |
| | 248-255 | 240-247 | 232-239 | 224-231 | 216-223 | 208-215 | 200-207 | 192-199 |

. . .

| MAT sub-group | SG56 | SG57 | SG58 | SG59 | SG60 | SG61 | SG62 | SG63 |
|---|---|---|---|---|---|---|---|---|
| MAT No. (CHIP7) | 896-903 | 904-911 | 912-919 | 920-927 | 928-935 | 936-943 | 944-951 | 952-959 |
| | 1016-1023 | 1008-1015 | 1000-1007 | 992-999 | 984-991 | 976-983 | 968-97 | 960-967 |

FIG. 6

| MAT sub-group | SG0 | SG1 | SG2 | SG3 | SG4 | SG5 | SG6 | SG7 |
|---|---|---|---|---|---|---|---|---|
| MAT No. (ROW ADDRESS ADDITIVE VALUE) (CHIP0) | 0-7 (+64) | 8-15 (+128) | 16-23 (+192) | 24-31 (+256) | 32-39 (+320) | 40-47 (+384) | 48-55 (+448) | 56-63 (+512) |
| | 120-127 (+64) | 112-119 (+128) | 104-111 (+192) | 96-103 (+256) | 88-95 (+320) | 80-87 (+384) | 72-79 (+448) | 64-71 (+512) |

| MAT sub-group | SG8 | SG9 | SG10 | SG11 | SG12 | SG13 | SG14 | SG15 |
|---|---|---|---|---|---|---|---|---|
| MAT No. (ROW ADDRESS ADDITIVE VALUE) (CHIP1) | 128-135 (+576) | 136-143 (+640) | 144-151 (+704) | 152-159 (+768) | 160-167 (+832) | 168-175 (+896) | 176-183 (+960) | 184-191 (+1024) |
| | 248-255 (+576) | 240-247 (+640) | 232-239 (+704) | 224-231 (+768) | 216-223 (+832) | 208-215 (+896) | 200-207 (+960) | 192-199 (+1024) |

. . .

| MAT sub-group | SG56 | SG57 | SG58 | SG59 | SG60 | SG61 | SG62 | SG63 |
|---|---|---|---|---|---|---|---|---|
| MAT No. (ROW ADDRESS ADDITIVE VALUE) (CHIP7) | 896-903 (+3648) | 904-911 (+3648) | 912-919 (+3776) | 920-927 (+3840) | 928-935 (+3904) | 936-943 (+3968) | 944-951 (+4032) | 952-959 (+4096) |
| | 1016-1023 (+3648) | 1008-1015 (+3648) | 1000-1007 (+3776) | 992-999 (+3840) | 984-991 (+3904) | 976-983 (+3968) | 968-97 (+4032) | 960-967 (+4096) |

FIG. 7

| MAT sub-group | SG0 | SG1 | SG2 | SG3 | SG4 | SG5 | SG6 | SG7 |
|---|---|---|---|---|---|---|---|---|
| MAT No. (COLUMN ADDRESS ADDITIVE VALUE) (CHIP0) | 0-7 (+32) | 8-15 (+64) | 16-23 (+96) | 24-31 (+128) | 32-39 (+160) | 40-47 (+192) | 48-55 (+224) | 56-63 (+256) |
| | 120-127 (+32) | 112-119 (+64) | 104-111 (+96) | 96-103 (+128) | 88-95 (+160) | 80-87 (+192) | 72-79 (+224) | 64-71 (+256) |

| MAT sub-group | SG8 | SG9 | SG10 | SG11 | SG12 | SG13 | SG14 | SG15 |
|---|---|---|---|---|---|---|---|---|
| MAT No. (COLUMN ADDRESS ADDITIVE VALUE) (CHIP1) | 128-135 (+288) | 136-143 (+320) | 144-151 (+352) | 152-159 (+384) | 160-167 (+416) | 168-175 (+448) | 176-183 (+480) | 184-191 (+512) |
| | 248-255 (+288) | 240-247 (+320) | 232-239 (+352) | 224-231 (+384) | 216-223 (+416) | 208-215 (+448) | 200-207 (+480) | 192-199 (+512) |

...

| MAT sub-group | SG56 | SG57 | SG58 | SG59 | SG60 | SG61 | SG62 | SG63 |
|---|---|---|---|---|---|---|---|---|
| MAT No. (COLUMN ADDRESS ADDITIVE VALUE) (CHIP7) | 896-903 (+1824) | 904-911 (+1856) | 912-919 (+1888) | 920-927 (+1920) | 928-935 (+1952) | 936-943 (+1984) | 944-951 (+2016) | 952-959 (+2048) |
| | 1016-1023 (+1824) | 1008-1015 (+1856) | 1000-1007 (+1888) | 992-999 (+1920) | 984-991 (+1952) | 976-983 (+1984) | 968-97 (+2016) | 960-967 (+2048) |

FIG. 9

| MAT sub-group | SG0 | SG1 | SG2 | SG3 |
|---|---|---|---|---|
| MAT No. (CHIP0) | 0-7 | 8-15 | 16-23 | 24-31 |
| | 32-39 | 40-47 | 48-55 | 56-63 |
| | 88-95 | 80-87 | 72-79 | 64-71 |
| | 120-127 | 112-119 | 104-111 | 96-103 |

...

| MAT sub-group | SG28 | SG29 | SG30 | SG31 |
|---|---|---|---|---|
| MAT No. (CHIP7) | 896-903 | 904-911 | 912-919 | 920-927 |
| | 928-935 | 936-943 | 944-951 | 952-959 |
| | 984-991 | 976-983 | 968-975 | 960-967 |
| | 1016-1023 | 1008-1015 | 1000-1007 | 992-999 |

FIG. 17

| MAT sub-group | SG0 | SG1 | SG2 | SG3 |
|---|---|---|---|---|
| MAT No. (ROW ADDRESS ADDITIVE VALUE) (CHIP0) | 0–7 (+128) | 8–15 (+256) | 16–23 (+384) | 24–31 (+512) |
| | 32–39 (+128) | 40–47 (+256) | 48–55 (+384) | 56–63 (+512) |
| | 88–95 (+128) | 80–87 (+256) | 72–79 (+384) | 64–71 (+512) |
| | 120–127 (+128) | 112–119 (+256) | 104–111 (+384) | 96–103 (+512) |

. . .

| MAT sub-group | SG28 | SG29 | SG30 | SG31 |
|---|---|---|---|---|
| MAT No. (ROW ADDRESS ADDITIVE VALUE) (CHIP7) | 896–903 (+3712) | 904–911 (+3840) | 912–919 (+3968) | 920–927 (+4096) |
| | 928–935 (+3712) | 936–943 (+3840) | 944–951 (+3968) | 952–959 (+4096) |
| | 984–991 (+3712) | 976–983 (+3840) | 968–975 (+3968) | 960–967 (+4096) |
| | 1016–1023 (+3712) | 1008–1015 (+3840) | 1000–1007 (+3968) | 992–999 (+4096) |

FIG. 18

| MAT sub-group | SG0 | SG1 | SG2 | SG3 |
|---|---|---|---|---|
| MAT No. (COLUMN ADDRESS ADDITIVE VALUE) (CHIP0) | 0-7 (+64) | 8-15 (+128) | 16-23 (+192) | 24-31 (+256) |
| | 32-39 (+64) | 40-47 (+128) | 48-55 (+192) | 56-63 (+256) |
| | 88-95 (+64) | 80-87 (+128) | 72-79 (+192) | 64-71 (+256) |
| | 120-127 (+64) | 112-119 (+128) | 104-111 (+192) | 96-103 (+256) |

. . .

| MAT sub-group | SG28 | SG29 | SG30 | SG31 |
|---|---|---|---|---|
| MAT No. (COLUMN ADDRESS ADDITIVE VALUE) (CHIP7) | 896-903 (+1856) | 904-911 (+1920) | 912-919 (+1984) | 920-927 (+1984) |
| | 928-935 (+1856) | 936-943 (+1920) | 944-951 (+1984) | 952-959 (+1984) |
| | 984-991 (+1856) | 976-983 (+1920) | 968-975 (+1984) | 960-967 (+1984) |
| | 1016-1023 (+1856) | 1008-1015 (+1920) | 1000-1007 (+1984) | 992-999 (+1984) |

FIG. 20

MEMORY SYSTEMS HAVING SUPPRESSED READ DISTURBANCE AND IMPROVED ERROR CORRECTION CAPABILITY

CROSS-REFERENCE TO RELATED APPLICATIONS

The present application claims priority under 35 U.S.C 119(a) to Korean Application No. 10-2019-0080189, filed on Jul. 3, 2019, which is incorporated herein by references in its entirety.

BACKGROUND

1. Technical Field

Various embodiments of the disclosed technology generally relate to memory systems, and more particularly, to memory systems having suppressed read disturbance and improved error correction capability.

2. Related Art

Recently, a lot of effort has been focused on developing next generation memory devices for replacing dynamic random access memory (DRAM) devices and flash memory devices. Resistance memory devices corresponding to the next generation memory devices employ a variable resistive material having any one state of at least two different resistive states according to a bias applied to the variable resistive material. The resistance memory devices may include, for example, phase-change random access memory (PCRAM) devices, resistive random access memory (RRAM) devices, magnetic random access memory (MRAM) devices, and ferroelectric random access memory (FRAM) devices. The resistance memory devices may be configured to include a plurality of memory cell arrays. Each of the plurality of memory cell arrays may have a cross point cell array structure. According to the cross point cell array structure, memory cells, each of which includes a variable resistive element and a switch element connected in series, may be located at respective cross points of a plurality of row lines and a plurality of column lines. In case of the resistance memory devices, read margins for discriminating between a datum "0" and a datum "1" may be relatively small as compared with other memory devices. The resistance memory devices functioning as nonvolatile memory devices may exhibit a relatively high error rate as compared with NAND-type flash memory devices even though the resistance memory devices are designed to have single-level cells.

SUMMARY

According to an embodiment, a memory system includes a memory medium, a row address adding circuit, and a column address adding circuit. The memory medium includes a plurality of matrices and a plurality of data input/output (I/O) terminals. The row address adding circuit adds row address additive values to an input row address for accessing memory cells of the plurality of matrices. The column address adding circuit adds column address additive values to an input column address for accessing memory cells of the plurality of matrices. The plurality of matrices are configured into a plurality of matrix sub-groups, wherein each matrix sub-group is comprised of matrices accessed through a common data I/O terminal of the data I/O terminals. The row address additive values are different from each other according to the matrix sub-groups, and the column address additive values are different from each other according to the matrix sub-groups.

BRIEF DESCRIPTION OF THE DRAWINGS

Certain features of the disclosed technology are illustrated by various embodiments with reference to the attached drawings, in which:

FIG. 6 is a table illustrating an example of distribution of matrices allocated to matrix sub-groups included in each of memory chips of a memory system according to an embodiment of the present disclosure;

FIG. 7 is a table illustrating an example of distribution of row address additive values for matrix sub-groups included in each of memory chips of a memory system according to an embodiment of the present disclosure;

FIG. 9 is a table illustrating an example of distribution of column address additive values for matrix sub-groups included in each of memory chips of a memory system according to an embodiment of the present disclosure;

FIG. 17 is a table illustrating another example of distribution of matrices allocated to matrix sub-groups included in each of memory chips of a memory system according to an embodiment of the present disclosure;

FIG. 18 is a table illustrating another example of distribution of row address additive values for matrix sub-groups included in each of memory chips of a memory system according to an embodiment of the present disclosure;

FIG. 20 is a table illustrating another example of distribution of column address additive values for matrix sub-groups included in each of memory chips of a memory system according to an embodiment of the present disclosure;

DETAILED DESCRIPTION OF THE EMBODIMENTS

In the following description of embodiments, it will be understood that the terms "first" and "second" are intended to identify elements and are not used to define a particular sequence or number of elements. In addition, when an element is referred to as being located "on", "over", "above", "under" or "beneath" another element, it is intended to mean relative position relationship, but not used to limit certain cases that the element directly contacts the other element, or at least one intervening element is present therebetween. Accordingly, the terms such as "on", "over", "above", "under", "beneath", "below" and the like that are used herein are for the purpose of describing particular embodiments only and are not intended to limit the scope of the present disclosure. Further, when an element is referred to as being "connected" or "coupled" to another element, the element may be electrically or mechanically connected or coupled to the other element directly, or may form a connection relationship or coupling relationship by replacing the other element therebetween.

Figure 1:
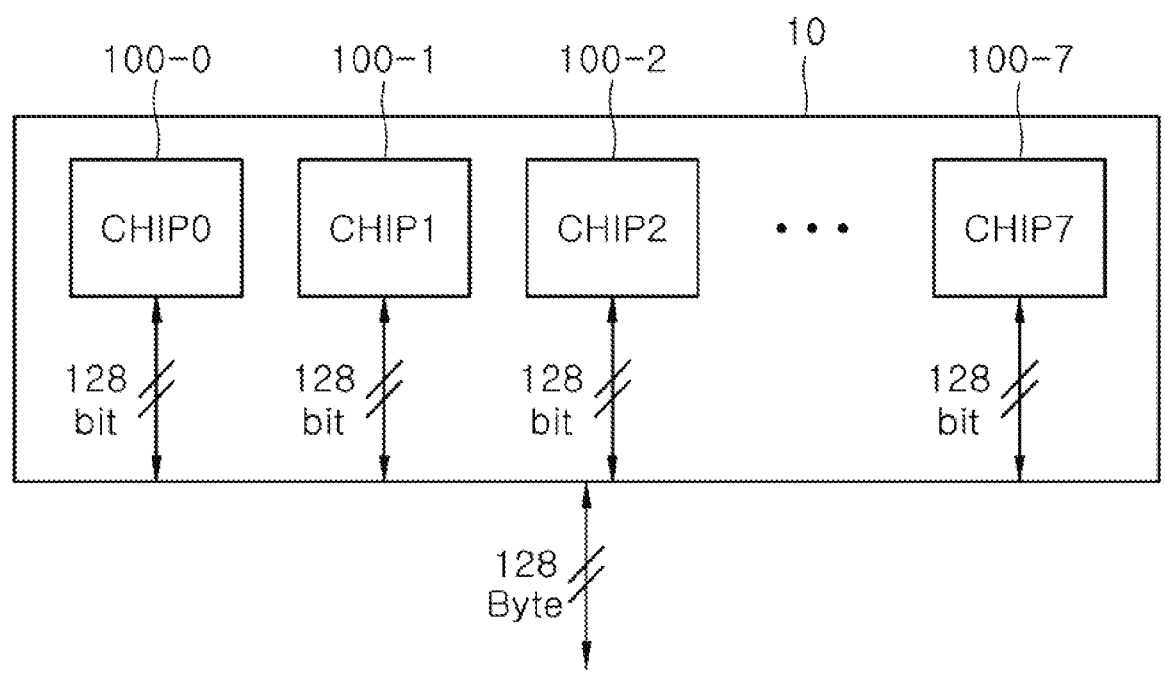
FIG. 1 is a schematic view illustrating an example of a memory medium included in a memory system according to an embodiment of the present disclosure.

FIG. 1 is a schematic view illustrating an example of a memory medium 10 included in a memory system according to an embodiment of the present disclosure. Referring to FIG. 1, the memory medium 10 may include a plurality of memory chips, for example, eight memory chips (i.e., first to eighth memory chips 100-0, 100-1, 100-2, . . . and 100-7). In an embodiment, the memory medium 10 may be a memory module, but not limited thereto. In an embodiment, data access to each of the first to eighth memory chips 100-0, 100-1, 100-2, . . . and 100-7 may be executed in units of 128 bits. In such a case, the data access to the memory medium 10 may be executed in units of 128 bytes.

Figure 2:
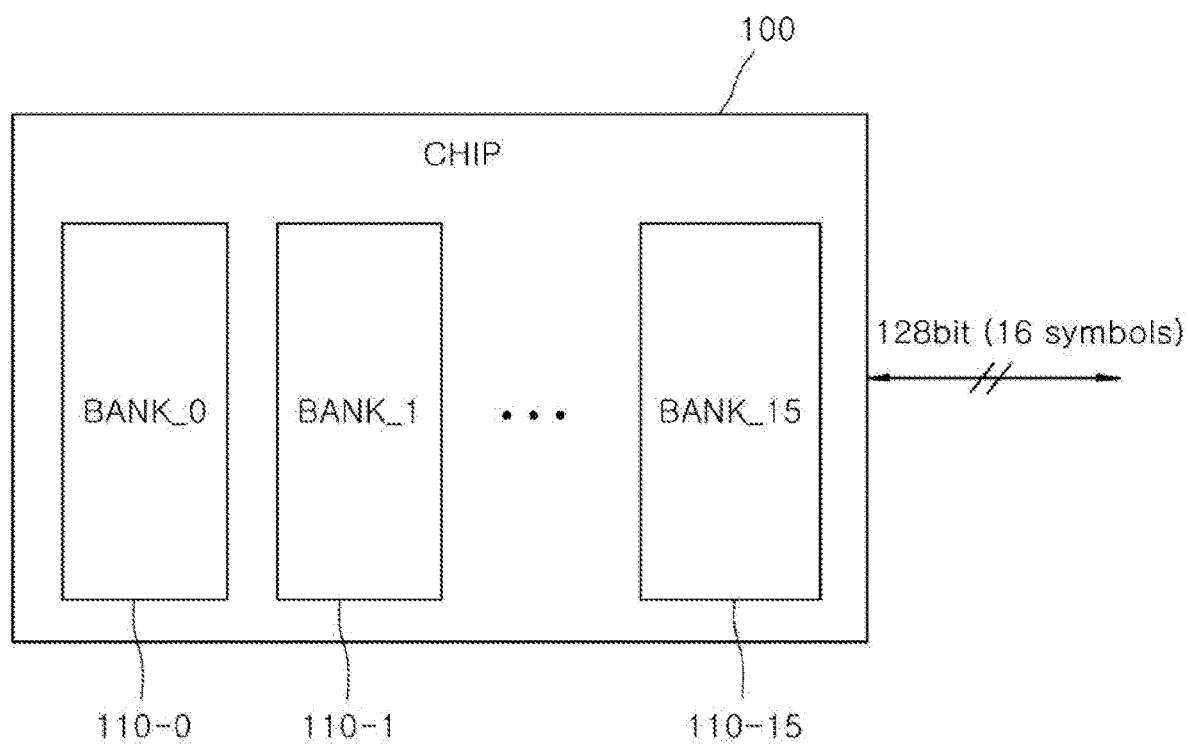
FIG. 2 is a schematic view illustrating a configuration of a memory chip included in the memory medium of FIG. 1.

FIG. 2 is a schematic view illustrating a configuration of a memory chip 100 included in the memory medium 10 of FIG. 1. Referring to FIG. 2, the memory chip 100 may correspond to one of the first to eighth memory chips 100-0, 100-1, 100-2, . . . and 100-7. Accordingly, the memory chip 100 may have the same configuration as each of the first to eighth memory chips 100-0, 100-1, 100-2, . . . and 100-7. The memory chip 100 may include a plurality of banks, for example, sixteen banks (e.g., first to sixteenth banks 110-0, 110-1, . . . and 110-15). Data access to each of the first to sixteenth banks 110-0, 110-1, . . . and 110-15 may be executed in units of 128 bits. In an embodiment, when 8-bit data constitute one ECC symbol, sixteen symbols may be outputted from each of the first to sixteenth banks 110-0, 110-1, . . . and 110-15. In an embodiment, one of the first to sixteenth banks 110-0, 110-1, . . . and 110-15 may be selected for execution of the data access. Accordingly, the data access to the memory chip 100 may be executed in units of 128 bits.

Figure 3:
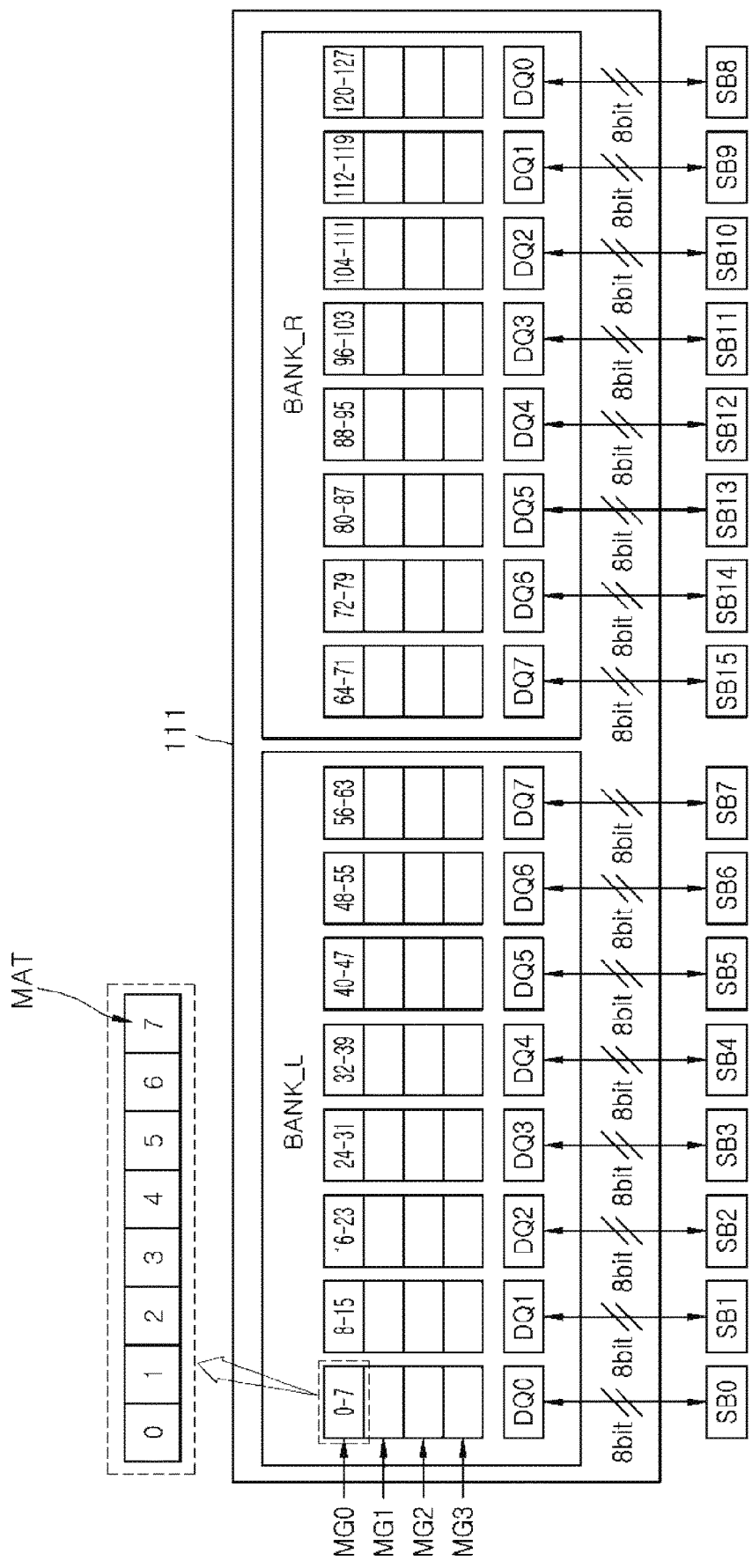
FIG. 3 is a schematic view illustrating an example of a bank included in the memory chip of a memory system according to an embodiment of the present disclosure.

FIG. 3 is a schematic view illustrating an example of a bank 111 included in the memory chip 100 of FIG. 2. Referring to FIG. 3, the bank 111 may correspond to one of the first to sixteenth banks 110-0, 110-1, . . . and 110-15. Accordingly, the bank 111 may have the same configuration as each of the first to sixteenth banks 110-0, 110-1, . . . and 110-15. The bank 111 may include a plurality of matrices MATs which are arrayed along rows and columns. The matrices MATs arrayed in the same row may constitute one matrix group MG. For example, the matrices MATs arrayed in the first row may constitute a first matrix group MG0, and the matrices MATs arrayed in the second row may constitute a second matrix group MG1. Similarly, the matrices MATs arrayed in the third row may constitute a third matrix group MG2, and the matrices MATs arrayed in the fourth row may constitute a fourth matrix group MG3.

In the present embodiment, the first matrix group MG0 may include 128 matrices, and the matrices in the first matrix group MG0 may be denoted by the corresponding numerals. For example, in the drawings, a numeral "0" means a first matrix MAT of the first matrix group MG0, and a numeral "127" means one hundred and twenty eighth matrix MAT of the first matrix group MG0. Although not shown in the drawings, each of the remaining matrix groups (i.e., the second to fourth matrix groups MG1, MG2 and MG3) may include 128 matrices. The data access to the bank 111 may be executed in units of matrix groups MGs. That is, the data access may be executed for 128 matrices belonging to any one selected from the first to fourth matrix groups MG0~MG3. The data access to one of the matrices MATs may be executed in unit of one bit. In such a case, the data access to one of the first to fourth matrix groups MG0~MG3 may be executed in units of 128 bits.

In an embodiment, the bank 111 may include a left bank BANK_L and a right bank BANK_R. If the number of the matrices MATs constituting each of the first to fourth matrix groups MG0~MG3 is "M", each of the left bank BANK_L and the right bank BANK_R may include "M/2"-number of matrices. In the present embodiment, the first to sixty fourth matrices "0", . . . and "63" among the 128 matrices constituting the first matrix group MG0 may belong to the left bank BANK_L, and the sixty fifth to the one hundred and twenty eighth matrices "64", . . . and "127" among the 128 matrices constituting the first matrix group MG0 may belong to the right bank BANK_R. Each of the remaining matrix groups (i.e., the second to fourth matrix groups MG1~MG3) may also be configured to include the left bank BANK_L and the right bank BANK_R which are divided in the same way. In the present embodiment, the data access to the left bank BANK_L and the right bank BANK_R may be executed through a plurality of data input/output (I/O) terminals DQ. If the number of the data I/O terminals DQ is "P" (where "P" is a natural number) and the number of the matrices MATs belonging to each matrix group MG is "M" (where "M" is a natural number), the data access through each data I/O terminal DQ may be executed in units of "M/(2×P)"-number of matrices. Although each of the left bank BANK_L and the right bank BANK_R is illustrated as including eight data I/O terminals DQ (i.e., first to eighth data I/O terminals DQ0~DQ7) in some of the drawings, the drawings are merely illustrated for better understanding of the present disclosure. That is, the left bank BANK_L and the right bank BANK_R may physically share the first to eighth data I/O terminals DQ0~DQ7 with each other. In the present embodiment, the data access to the left bank BANK_L and the right bank BANK_R may be executed through the first to eighth data I/O terminals DQ0~DQ7. Because the number of the matrices MATs to which the data access is simultaneously executed is 128, the data access to sixteen matrices MATs (corresponding to eight matrices MATs in the left bank BANK_L and eight matrices in the right bank BANK_R) may be executed through one of the first to eighth data I/O terminals DQ0~DQ7.

In an embodiment, the matrices MATs in each of the first to fourth matrix groups MG0~MG3 may be arrayed in units of 8 matrices, and the data access to the eight matrices may be executed through one of the first to eighth data I/O terminals DQ0~DQ7. For example, the data access to the first to eighth matrices "0-7" of the left bank BANK_L among the matrices MATs of the first matrix group MG0 may be executed through the first data I/O terminal DQ0. Because the data access to one matrix MAT is executed in unit of one bit, 8-bit data may be inputted to or outputted from the left bank BANK_L through the first data I/O terminal DQ0. Similarly, the data access to the ninth to sixteenth matrices "8-15" of the left bank BANK_L among the matrices MATs of the first matrix group MG0 may be executed through the second data I/O terminal DQ1. In this way, the data access to the fifty seventh to sixty fourth matrices "56-63" of the left bank BANK_L among the matrices MATs of the first matrix group MG0 may be executed through the eighth data I/O terminal DQ7.

The right bank BANK_R may be configured to be symmetric to the left bank BANK_L in terms of the data access executed through the first to eighth data I/O terminals DQ0~DQ7. In such a case, the data access to the one hundred and twenty first to one hundred and twenty eighth matrices "120-127" of the right bank BANK_R among the matrices MATs of the first matrix group MG0 may be executed through the first data I/O terminal DQ0. Similarly, the data access to the one hundred and thirteenth to one hundred and twentieth matrices "112-119" of the right bank BANK_R among the matrices MATs of the first matrix group MG0 may be executed through the second data I/O terminal DQ1. In this way, the data access to the sixty fifth to seventy second matrices "64-71" of the right bank BANK_R among the matrices MATs of the first matrix group MG0 may be executed through the eighth data I/O terminal DQ7.

In the left bank BANK_L, 8-bit data may be transmitted through each of the first to eighth data I/O terminals DQ0~DQ7. Similarly, even in the right bank BANK_R, 8-bit data may be transmitted through each of the first to eighth data I/O terminals DQ0~DQ7. In an embodiment, after the data access to the left bank BANK_L is executed through the data I/O terminals DQ0~DQ7, the data access to the right bank BANK_R may be executed through the data I/O terminals DQ0~DQ7. Thus, the data access to the bank 111 may be executed in units of 128 bits. In an embodiment, an error correction operation performed during the data access to the memory medium 10 may be executed in units of symbols. "M"-bit data simultaneously inputted to or outputted from the left and right banks BANK_L and BANK_R may be configured to include "2P"-number of ECC symbols, each of which is comprised of 8-bit data. In the present embodiment, 128-bit data simultaneously inputted to or outputted from the left and right banks BANK_L and BANK_R may be configured to include first to sixteenth symbols SB0~SB15, each of which is comprised of 8-bit data.

Because the number of data bits constituting one symbol is equal to the number of data bits transmitted through one data I/O terminal DQ in the left bank BANK_L or the right bank BANK_R, the symbols may be matched with the data I/O terminals in one to one. In an embodiment, 8-bit data inputted to or outputted from the left bank BANK_L through the first data I/O terminal DQ0 may constitute the first symbol SB0, and 8-bit data inputted to or outputted from the left bank BANK_L through the second data I/O terminal DQ1 may constitute the second symbol SB1. In the same way, 8-bit data inputted to or outputted from the left bank BANK_L through the eighth data I/O terminal DQ7 may constitute the eighth symbol SB7. Similarly, 8-bit data inputted to or outputted from the right bank BANK_R through the first data I/O terminal DQ0 may constitute the ninth symbol SB8, and 8-bit data inputted to or outputted from the right bank BANK_R through the second data I/O terminal DQ1 may constitute the tenth symbol SB9. In the same way, 8-bit data inputted to or outputted from the right bank BANK_R through the eighth data I/O terminal DQ7 may constitute the sixteenth symbol SB15.

Figure 4:
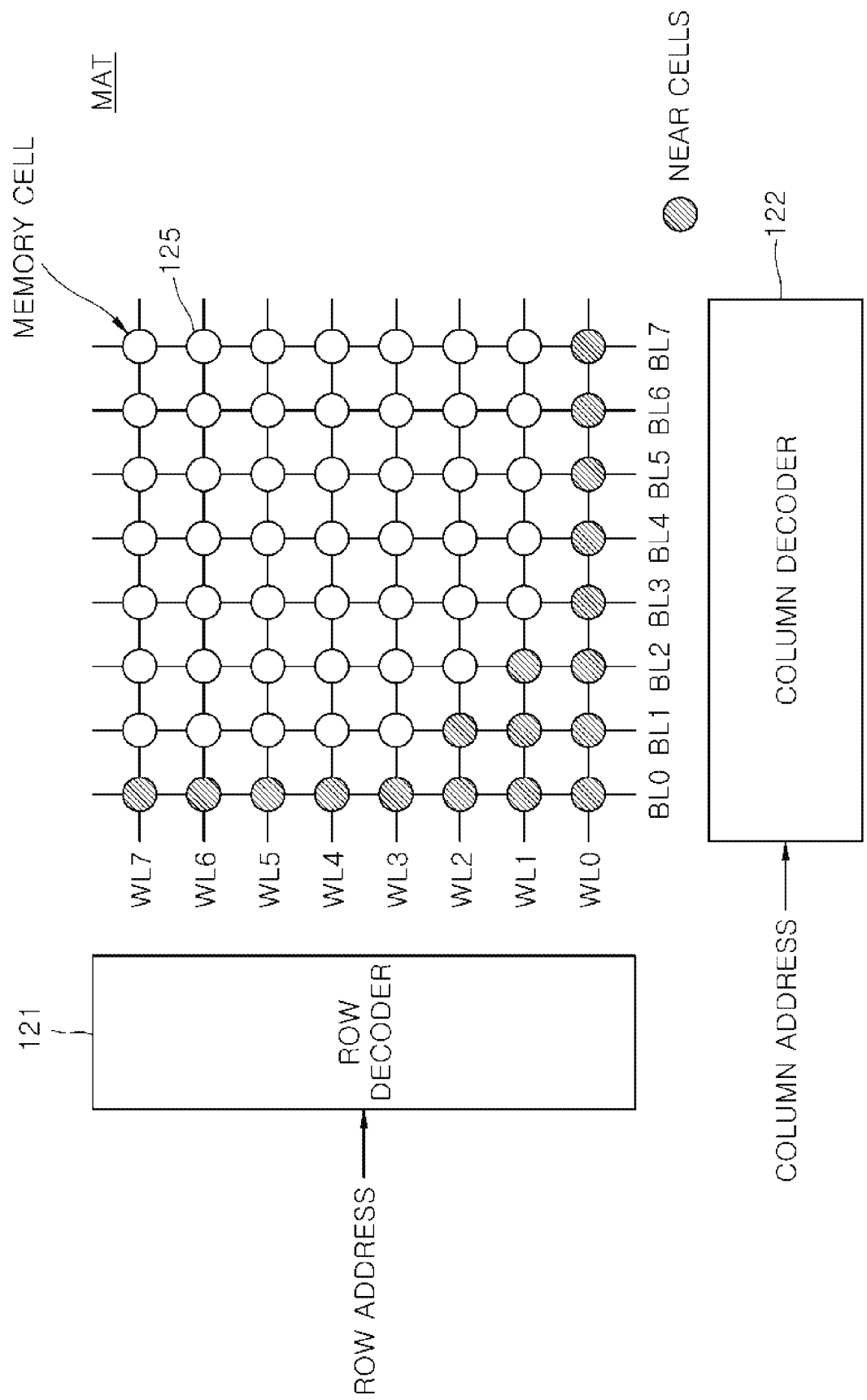
FIG. 4 is a schematic view illustrating an example of a matrix included in a bank of a memory system according to an embodiment of the present disclosure.

FIG. 4 is a schematic view illustrating an example of the matrix MAT included in the bank 111 of FIG. 3. Referring to FIG. 4, the matrix MAT may have a cell array structure including a plurality of word lines (e.g., first to eighth word lines WL0~WL7), a plurality of bit lines (e.g., first to eighth bit lines BL0~BL7), a plurality of memory cells, a row decoder 121 and a column decoder 122. The word lines WL0~WL7 may be disposed to be parallel with a first direction corresponding to a row direction. The bit lines BL0~BL7 may be disposed to be parallel with a second direction corresponding to a column direction. The plurality of memory cells may be located at cross points of the word lines WL0~WL7 and the bit lines BL0~BL7, respectively. In an embodiment, the plurality of memory cells may be nonvolatile memory cells such as PCRAM cells, MRAM cells, nano floating gate memory (NFGM) cells, RRAM cells, or polymer RAM cells. The row decoder 121 may be configured to select one of the word lines WL0~WL7 in response to a row address. The column decoder 122 may be configured to select one of the bit lines BL0~BL7 in response to a column address.

The data access to the matrix MAT may be executed for one selected from the memory cells included in the matrix MAT. One of the word lines WL0~WL7 may be selected by the row decoder 121, and one of the bit lines BL0~BL7 may be selected by the column decoder 122. The selected word line and the selected bit line may be designated by the row address and the column address. In such a case, one memory cell located at a cross point of the selected word line and the selected bit may be selected. During the data access to the matrix MAT, a datum stored in the selected memory cell may be outputted or a datum may be stored into the selected memory cell. For example, if the seventh word line WL6 and the eighth bit line BL7 are selected by the row decoder 121 and the column decoder 122, a memory cell 125 located at a cross point of the seventh word line WL6 and the eighth bit line BL7 may be selected and the data access to the selected memory cell 125 may be executed. Thus, the data access to the matrix MAT may be executed in unit of one bit.

During a read operation, a current may flow from the column decoder 122 toward the row decoder 121 through a selected bit line, a selected memory cell, and a selected word line in the cell array structure. In such a case, a parasitic current may also flow through non-selected memory cells sharing the selected bit line and the selected word line with the selected memory cell. Due to the parasitic current, a read disturbance phenomenon may occur during the next read operation for any one of the non-selected memory cells. The read disturbance phenomenon may also occur due to heat generated by the row decoder 121 and the column decoder 122. Accordingly, as denoted by "near cells" in FIG. 4, the memory cells disposed to be adjacent to the row decoder 121 and the column decoder 122 may more severely suffer from the read disturbance phenomenon.

Figure 5:
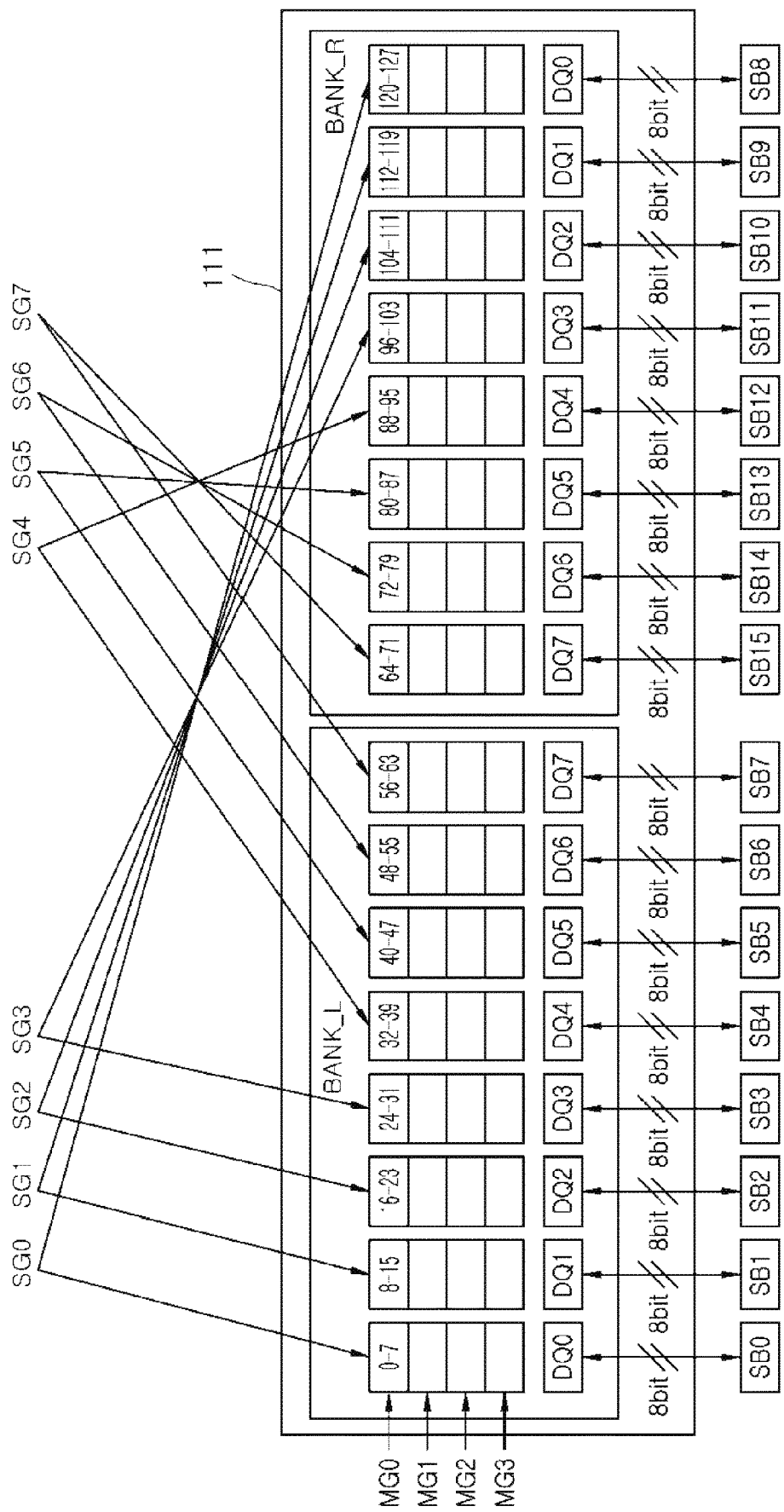
FIG. 5 is a schematic view illustrating an example of a matrix sub-grouping process of matrices included in a bank of a memory system according to an embodiment of the present disclosure.

FIGS. 5 and 6 illustrate an example of a sub-grouping process of matrices in a memory system according to an embodiment of the present disclosure. Specifically, FIG. 5 is a schematic view illustrating an example of a sub-grouping process of the matrices included in the bank 111 of FIG. 3, and FIG. 6 is a table illustrating an example of distribution of the matrices allocated to matrix sub-groups included in each of the first to eighth memory chips 100-0, 100-1, . . . and 100-7 shown in FIG. 1. In FIG. 5, the same reference numerals and characters as used in FIG. 3 denote the same elements. First, referring to FIG. 5, the matrices MATs constituting the bank 111 may be classified into a plurality of matrix sub-groups SG. The number of the matrix sub-groups SG may be set to be equal to the number of the data I/O terminals DQ. The number of the matrices MATs included in each of the matrix sub-groups SG may be equal to the number of data bits transmitted through each of the data I/O terminals DQ. That is, the matrices sharing one data I/O terminal DQ with each other may constitute one matrix sub-group SG. As described in the present embodiment, when the number of the data I/O terminals DQ is eight, the matrices MATs may be classified into eight matrix sub-groups (i.e., first to eighth matrix sub-groups SG0~SG7. Because 16-bit data (8-bit data for the left bank BANK_L and 8-bit data for the right bank BANK_R) are transmitted through one data I/O terminal DQ during the data access, sixteen matrices MATs may be allocated to each of the matrix sub-groups SG.

Specifically, the first matrix sub-group SG0 may be configured to include the matrices sharing the first data I/O terminal DQ0 with each other in the left bank BANK_L and the right bank BANK_R. Thus, the first matrix sub-group SG0 may include the first to eighth matrices "0-7" and the one hundred and twenty first to one hundred and twenty eighth matrices "120-127" among the matrices of the first matrix group MG0. In addition, the first matrix sub-group SG0 may be configured to include the matrices sharing the first data I/O terminal DQ0 with each other in the left bank BANK_L and the right bank BANK_R of each of the second to fourth matrix groups MG1~MG3. Thus, data inputted to or outputted from the matrices in the left bank BANK_L among the matrices belonging to the first matrix sub-group SG0 may constitute the first symbol SB0, and data inputted to or outputted from the matrices in the right bank BANK_R among the matrices belonging to the first matrix sub-group SG0 may constitute the ninth symbol SB8.

The second matrix sub-group SG1 may be configured to include the matrices sharing the second data I/O terminal DQ1 with each other in the left bank BANK_L and the right bank BANK_R. Thus, the second matrix sub-group SG1 may include the ninth to sixteenth matrices "8-15" and the one hundred and thirteenth to one hundred and twentieth matrices "112-119" among the matrices of the first matrix group MG0. In addition, the second matrix sub-group SG1 may be configured to include the matrices sharing the second data I/O terminal DQ1 with each other in the left bank BANK_L and the right bank BANK_R of each of the second to fourth matrix groups MG1~MG3. Thus, data inputted to or outputted from the matrices in the left bank BANK_L among the matrices belonging to the second matrix sub-group SG1 may constitute the second symbol SB1, and data inputted to or outputted from the matrices in the right bank BANK_R among the matrices belonging to the second matrix sub-group SG1 may constitute the tenth symbol SB9.

The third matrix sub-group SG2 may be configured to include the matrices sharing the third data I/O terminal DQ2 with each other in the left bank BANK_L and the right bank BANK_R. Thus, the third matrix sub-group SG2 may include the seventeenth to twenty fourth matrices "16-23" and the one hundred and fifth to one hundred and twelfth matrices "104-111" among the matrices of the first matrix group MG0. In addition, the third matrix sub-group SG2 may be configured to include the matrices sharing the third data I/O terminal DQ2 with each other in the left bank BANK_L and the right bank BANK_R of each of the second to fourth matrix groups MG1~MG3. Thus, data inputted to or outputted from the matrices in the left bank BANK_L among the matrices belonging to the third matrix sub-group SG2 may constitute the third symbol SB2, and data inputted to or outputted from the matrices in the right bank BANK_R among the matrices belonging to the third matrix sub-group SG2 may constitute the eleventh symbol SB10.

The fourth matrix sub-group SG3 may be configured to include the matrices sharing the fourth data I/O terminal DQ3 with each other in the left bank BANK_L and the right bank BANK_R. Thus, the fourth matrix sub-group SG3 may include the twenty fifth to thirty second matrices "24-31" and the ninety seventh to one hundred and fourth matrices "96-103" among the matrices of the first matrix group MG0. In addition, the fourth matrix sub-group SG3 may be configured to include the matrices sharing the fourth data I/O terminal DQ3 with each other in the left bank BANK_L and the right bank BANK_R of each of the second to fourth matrix groups MG1~MG3. Thus, data inputted to or outputted from the matrices in the left bank BANK_L among the matrices belonging to the fourth matrix sub-group SG3 may constitute the fourth symbol SB3, and data inputted to or outputted from the matrices in the right bank BANK_R among the matrices belonging to the fourth matrix sub-group SG3 may constitute the twelfth symbol SB11.

The fifth matrix sub-group SG4 may be configured to include the matrices sharing the fifth data I/O terminal DQ4 with each other in the left bank BANK_L and the right bank BANK_R. Thus, the fifth matrix sub-group SG4 may include the thirty third to fortieth matrices "32-39" and the eighty ninth to ninety sixth matrices "88-95" among the matrices of the first matrix group MG0. In addition, the fifth matrix sub-group SG4 may be configured to include the matrices sharing the fifth data I/O terminal DQ4 with each other in the left bank BANK_L and the right bank BANK_R of each of the second to fourth matrix groups MG1~MG3. Thus, data inputted to or outputted from the matrices in the left bank BANK_L among the matrices belonging to the fifth matrix sub-group SG4 may constitute the fifth symbol SB4, and data inputted to or outputted from the matrices in the right bank BANK_R among the matrices belonging to the fifth matrix sub-group SG4 may constitute the thirteenth symbol SB12.

The sixth matrix sub-group SG5 may be configured to include the matrices sharing the sixth data I/O terminal DQ5 with each other in the left bank BANK_L and the right bank BANK_R. Thus, the sixth matrix sub-group SG5 may include the forty first to forty eighth matrices "40-47" and the eighty first to eighty eighth matrices "80-87" among the matrices of the first matrix group MG0. In addition, the sixth matrix sub-group SG5 may be configured to include the matrices sharing the sixth data I/O terminal DQ5 with each other in the left bank BANK_L and the right bank BANK_R of each of the second to fourth matrix groups MG1~MG3. Thus, data inputted to or outputted from the matrices in the left bank BANK_L among the matrices belonging to the sixth matrix sub-group SG5 may constitute the sixth symbol SB5, and data inputted to or outputted from the matrices in the right bank BANK_R among the matrices belonging to the sixth matrix sub-group SG5 may constitute the fourteenth symbol SB13.

The seventh matrix sub-group SG6 may be configured to include the matrices sharing the seventh data I/O terminal DQ6 with each other in the left bank BANK_L and the right bank BANK_R. Thus, the seventh matrix sub-group SG6 may include the forty ninth to fifty sixth matrices "48-55" and the seventy third to eightieth matrices "72-79" among the matrices of the first matrix group MG0. In addition, the seventh matrix sub-group SG6 may be configured to include the matrices sharing the seventh data I/O terminal DQ6 with each other in the left bank BANK_L and the right bank BANK_R of each of the second to fourth matrix groups MG1~MG3. Thus, data inputted to or outputted from the matrices in the left bank BANK_L among the matrices belonging to the seventh matrix sub-group SG6 may constitute the seventh symbol SB6, and data inputted to or outputted from the matrices in the right bank BANK_R among the matrices belonging to the seventh matrix sub-group SG6 may constitute the fifteenth symbol SB14.

The eighth matrix sub-group SG7 may be configured to include the matrices sharing the eighth data I/O terminal DQ7 with each other in the left bank BANK_L and the right bank BANK_R. Thus, the eighth matrix sub-group SG7 may include the fifty seventh to seventy second matrices "56-71" among the matrices of the first matrix group MG0. In addition, the eighth matrix sub-group SG7 may be configured to include the matrices sharing the eighth data I/O terminal DQ7 with each other in the left bank BANK_L and the right bank BANK_R of each of the second to fourth matrix groups MG1~MG3. Thus, data inputted to or outputted from the matrices in the left bank BANK_L among the matrices belonging to the eighth matrix sub-group SG7 may constitute the eighth symbol SB7, and data inputted to or outputted from the matrices in the right bank BANK_R among the matrices belonging to the eighth matrix sub-group SG7 may constitute the sixteenth symbol SB15.

Referring to FIG. 6, the matrices MATs belonging to each of the matrix groups MG0~MG3 in a bank of the first memory chip (CHIP0) 100-0 may be classified into the first to eighth matrix sub-groups SG0~SG7. Although FIG. 6 illustrates only the distribution of the matrices for the matrix sub-groups SG0~SG7 in the first matrix group MG0, the matrices of the matrix sub-groups SG0~SG7 in each of the remaining matrix groups MG1~MG3 may also exhibit the same distribution as illustrated in FIG. 6. In addition, the matrices of each of the remaining banks in the first memory chip (CHIP0) 100-0 may also exhibit the same distribution as illustrated in FIG. 6. The matrices of the matrix sub-groups SG in the first memory chip (CHIP0) 100-0 may exhibit the same distribution as described with reference to FIG. 5.

The matrices MATs belonging to each of the matrix groups in a bank of the second memory chip (CHIP1) 100-1 may be classified into the ninth to sixteenth matrix sub-groups SG8~SG15. For example, the ninth matrix sub-group SG8 of the second memory chip (CHIP1) 100-1 may be configured to include $129^{th}$ to $136^{th}$ matrices "128-135" (corresponding to the first to eighth matrices "0-7" in the first memory chip (CHIP0)) and $249^{th}$ to $256^{th}$ matrices "248-255" (corresponding to the $121^{th}$ to $128^{th}$ matrices "120-127" in the first memory chip (CHIP0)). Similarly, the matrices MATs belonging to each of the matrix groups in a bank of the eighth memory chip (CHIP7) 100-7 may be classified into the fifty seventh to sixty fourth matrix sub-groups SG56~SG63. For example, the sixty fourth matrix sub-group SG63 of the eighth memory chip (CHIP7) 100-7 may be configured to include $953^{th}$ to $968^{th}$ matrices "952-967" (corresponding to the fifty seventh to seventy second matrices "56-71" in the first memory chip (CHIP0)).

According to the configuration described above, when a memory medium is configured to include eight memory chips, each of which is comprised of a plurality of banks and the data excess to each of the banks is executed through eight data I/O terminals, matrices accessed during a single data access process may be classified into sixty four matrix sub-groups (i.e., first to sixty fourth matrix sub-groups SG0~SG63). Each of the matrix sub-groups may be configured to include sixteen matrices. A memory system according to an embodiment of the present disclosure may allocate different row addresses and column addresses to respective ones of the matrix sub-groups. In such a case, locations of memory cells accessed in matrices may be different from each other according to the matrices executing a data access process through the same data I/O terminal (i.e., according to the matrix sub-groups). As a result, the near cells may be concentrated on one symbol (i.e., data accessed through one data I/O terminal DQ). Thus, when an error correction operation is performed in units of symbols, the error correction operation may be more efficiently performed as compared with a case that the near cells are dispersed in several symbols. Moreover, even when errors occur due to malfunction of the data I/O terminal, the number of symbols to be corrected might not increase.

FIG. 7 is a table illustrating an example of distribution of row address additive values for the matrix sub-groups SGs included in each of the memory chips 100-0, ... and 100-7 shown in FIG. 1. Referring to FIG. 7, the row address additive values may be added to row addresses inputted to the memory chip in units of matrix sub-groups SG for all of the matrices belonging to the first to sixty fourth matrix sub-groups SG0~SG63 included in the first to eighth memory chips CHIP0~CHIP7. The row address additive values may be set to have weighted values for the matrix sub-groups SG. That is, the first to sixty fourth matrix sub-groups SG0~SG63 may have the row address additive values which are different from each other. In an embodiment, the row address additive values of the first to sixty fourth matrix sub-groups SG0~SG63 may sequentially increase.

An increment of the row address additive values of the first to sixty fourth matrix sub-groups SG0~SG63 may be set to be different according to a cell array structure of each of the matrices MATs. When the matrix MAT is comprised of a cell array structure having "R"-number of row addresses ("R" denotes a natural number) and the number of the matrix sub-groups SG is "J" ("J" denotes a natural number), the increment of the row address additive values of the matrix sub-groups SG may be set to be "R/J". For example, when the cell array structure of the matrix MAT is designed to have 4096 row addresses and the number of the matrix sub-groups SG is 64, the increment of the row address additive values of the matrix sub-groups SG may be set as 64 such that the row addresses of all of the cell array structures are equally distributed in the 64 matrix sub-groups SG. Thus, the row address additive value of "+64" may be added to the input row address for the matrices "0-7" and "120-127" in the first matrix sub-group SG0 of the first memory chip (CHIP0), and the row address additive value of "+128" may be added to the input row address for the matrices "8-15" and "112-119" in the second matrix sub-group SG1 of the first memory chip (CHIP0). In this way, the row address additive value of "+512" may be added to the input row address for the matrices "56-71" in the eighth matrix sub-group SG7 of the first memory chip (CHIP0).

The row address additive value of "+576" may be added to the input row address for the matrices "128-135" and "248-255" in the first matrix sub-group (corresponding to the ninth matrix sub-group SG8) of the second memory chip (CHIP1). Moreover, the row address additive values added to the input row addresses for the matrices from the second matrix sub-group (corresponding to the tenth matrix sub-group SG9) of the second memory chip (CHIP1) to the eighth matrix sub-group (corresponding to the sixteenth matrix sub-group SG15) of the second memory chip (CHIP1) may be set to be sequentially increased by an increment of "64". The row address additive values for the third to eighth memory chips may also be set by the same way as described above. For example, the row address additive value of "+3648" may be added to the input row address for the matrices "896-903" and "1016-1023" in the first matrix sub-group (corresponding to the 57$^{th}$ matrix sub-group SG56) of the eighth memory chip (CHIP7), and the row address additive values added to the input row addresses for the matrices from the second matrix sub-group (corresponding to the 58$^{th}$ matrix sub-group SG57) of the eighth memory chip (CHIP7) to the eighth matrix sub-group (corresponding to the 64$^{th}$ matrix sub-group SG63) of the eighth memory chip (CHIP7) may be set to be sequentially increased by an increment of "64".

Figure 8:
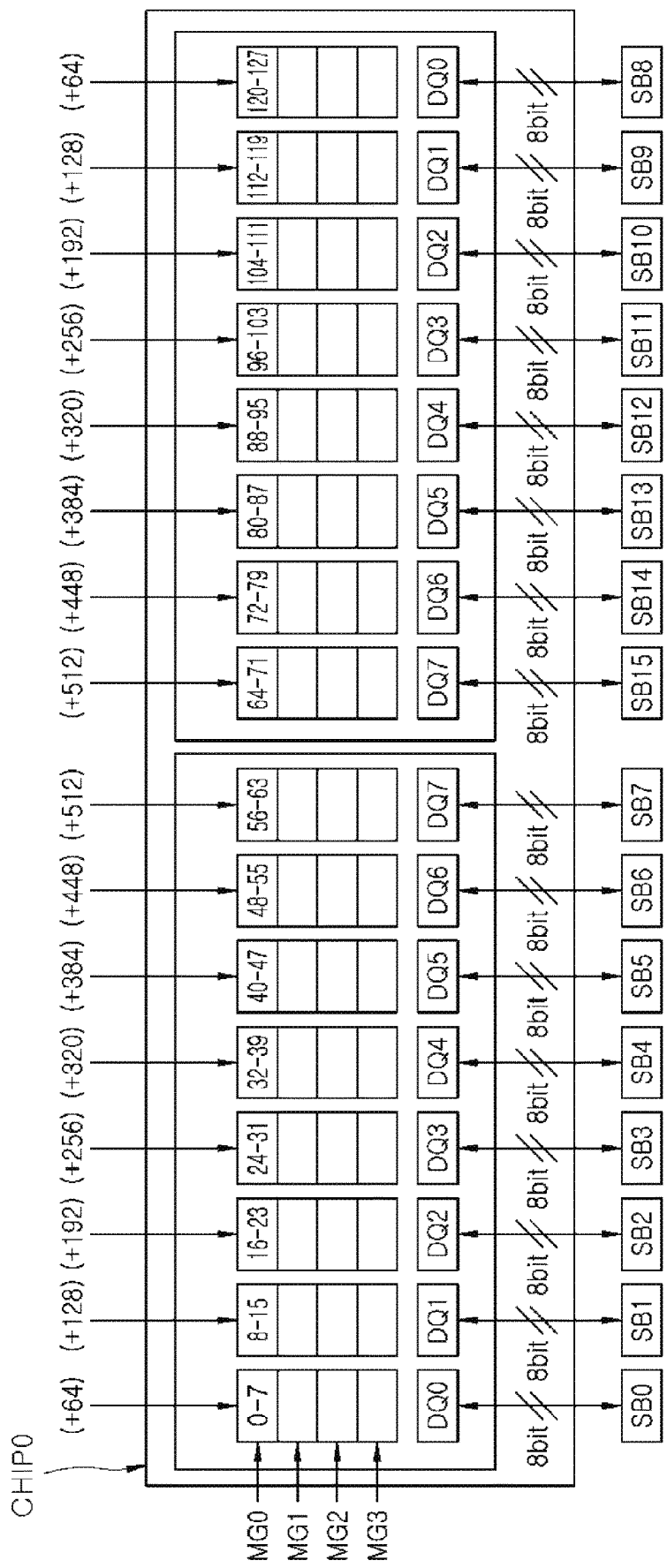
FIG. 8 is a schematic view illustrating an example of a row address adding process for matrix sub-groups in each of banks included in a memory system according to an embodiment of the present disclosure.

FIG. 8 is a schematic view illustrating an example of a row address adding process for the matrix sub-groups SG in the bank 111 of FIG. 5. Referring to FIG. 8, in an example of the data access to the first matrix group MG0 of the first memory chip (CHIP0), the matrices "0-7" of the left bank BANK_L and the matrices "120-127" of the right bank BANK_R which are accessed through the first data I/O terminal DQ0 among the matrices of a selected bank in the first memory chip (CHIP0) may constitute the first matrix sub-group SG0. The row address additive value of "+64" may be added to the input row address for the matrices "0-7" and "120-127" constituting the first matrix sub-group SG0. Thus, a row address of a memory cell accessed in each of the matrices "0-7" and "120-127" constituting the first matrix sub-group SG0 may be changed by "+64" from the input row address. Because the addition to the row address is executed in units of the matrix sub-groups SG, the row addresses for the matrices "0-7" and "120-127" constituting the first matrix sub-group SG0 may be changed by the same increment.

The row address variation for the matrices constituting each of the remaining matrix sub-groups (i.e., the second to eighth matrix sub-groups SG1~SG7) may occur to be similar to the row address variation for the matrices constituting the first matrix sub-group SG0. For example, the row address additive value of "+512" may be added to the input row address for the matrices constituting the eighth matrix sub-group SG7 (i.e., the matrices "56-63" in the left bank BANK_L and the matrices "64-71" in the right bank BANK_R which are accessed through the eighth data I/O terminal DQ7). Thus, a row address of memory cells accessed in each of the matrices "56-71" constituting the eighth matrix sub-group SG7 may be changed by a value of "+512" from the input row address. Even in such a case, because the addition to the row address is executed in units of the matrix sub-groups SG, the row addresses for the matrices "56-71" constituting the eighth matrix sub-group SG7 may be changed by the same increment. The row address variation for each of the remaining memory chips (i.e., the second to eighth memory chips CHIP1~CHIP7) may also occur in units of the matrix sub-groups by the row address additive values illustrated in FIG. 7.

FIG. 9 is a table illustrating an example of distribution of column address additive values for the matrix sub-groups included in each of the memory chips of the memory system according to an embodiment of the present disclosure. Referring to FIG. 9, the column address additive values may be added to column addresses inputted to the memory chip in units of matrix sub-groups SG for all of the matrices belonging to the first to sixty fourth matrix sub-groups SG0~SG63 included in the first to eighth memory chips CHIP0~CHIP7. The column address additive values may be set to have weighted values for the matrix sub-groups SG. That is, the first to sixty fourth matrix sub-groups SG0~SG63 may have the column address additive values which are different from each other. In an embodiment, the column address additive values of the first to sixty fourth matrix sub-groups SG0~SG63 may sequentially increase.

An increment of the column address additive values of the first to sixty fourth matrix sub-groups SG0~SG63 may be set to be different according to a cell array structure of each of the matrices MATs. When the matrix MAT is comprised of a cell array structure having "C"-number of column addresses ("C" denotes a natural number) and the number of the matrix sub-groups SG is "J" ("J" denotes a natural number), the increment of the column address additive values of the matrix sub-groups SG may be set to be "C/J". For example, when the cell array structure of the matrix MAT is designed to have 2048 column addresses and the number of the matrix sub-groups SG is 64, the increment of the column address additive values of the matrix sub-groups SG may be set as 32 such that the column addresses of all of the cell array structures are equally distributed in the 64 matrix sub-groups SG. Thus, the column address additive value of "+32" may be added to the input column address for the matrices "0-7" and "120-127" in the first matrix sub-group SG0 of the first memory chip (CHIP0), and the column address additive value of "+64" may be added to the input column address for the matrices "8-15" and "112-119" in the second matrix sub-group SG1 of the first memory chip (CHIP0). In this way, the column address additive value of "+256" may be added to the input column address for the matrices "56-71" in the eighth matrix sub-group SG7 of the first memory chip (CHIP0).

The column address additive value of "+288" may be added to the input column address for the matrices "128-135" and "248-255" in the first matrix sub-group (corresponding to the ninth matrix sub-group SG8) of the second memory chip (CHIP1). Moreover, the column address additive values added to the input column addresses for the matrices from the second matrix sub-group (corresponding to the tenth matrix sub-group SG9) of the second memory chip (CHIP1) to the eighth matrix sub-group (corresponding to the sixteenth matrix sub-group SG15) of the second memory chip (CHIP1) may be set to be sequentially increased by an increment of "32". The column address additive values for the third to eighth memory chips may also be set by the same way as described above. For example, the column address additive value of "+1824" may be added to the input column address for the matrices "896-903" and "1016-1023" in the first matrix sub-group (corresponding to the 57$^{th}$ matrix sub-group SG56) of the eighth memory chip (CHIP7), and the column address additive values added to the input column addresses for the matrices from the second matrix sub-group (corresponding to the 58$^{th}$ matrix sub-group SG57) of the eighth memory chip (CHIP7) to the eighth matrix sub-group (corresponding to the 64$^{th}$ matrix sub-group SG63) of the eighth memory chip (CHIP7) may be set to be sequentially increased by an increment of "32".

Figure 10:
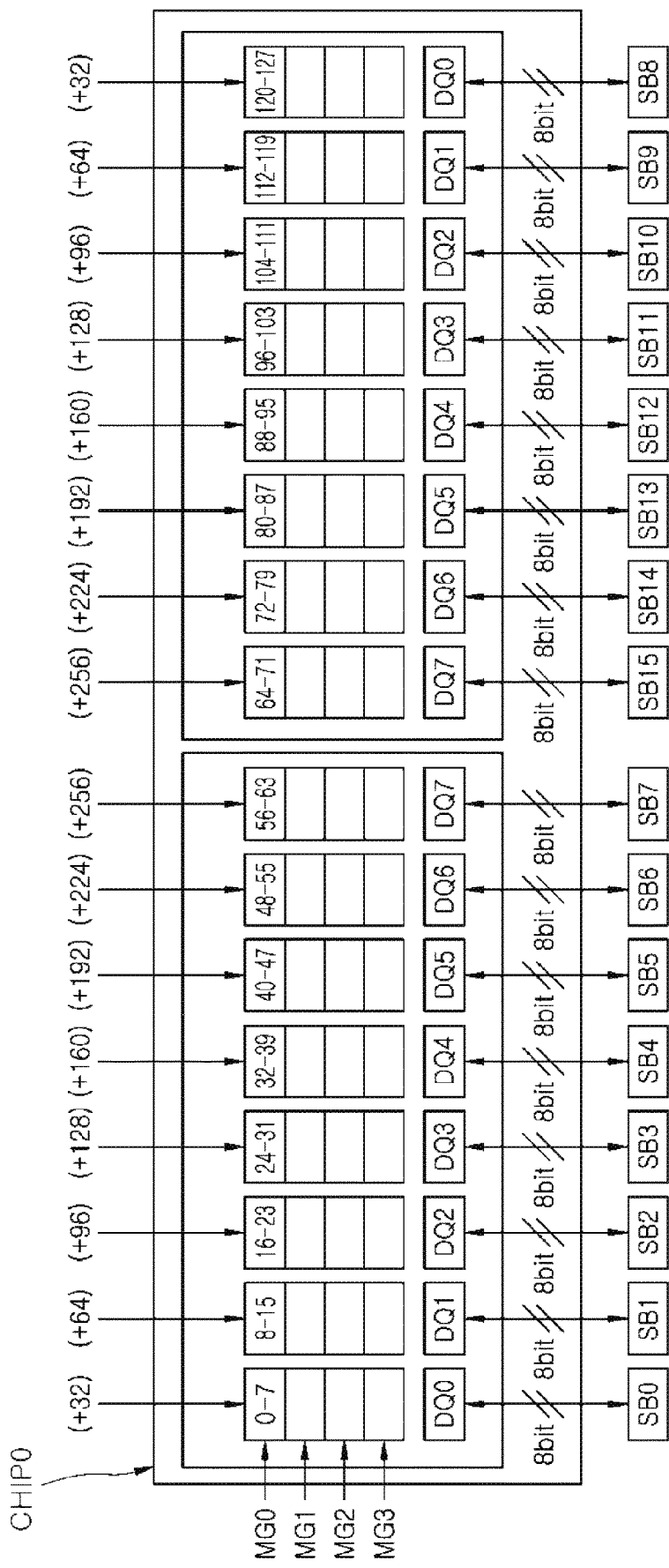
FIG. 10 is a schematic view illustrating an example of a column address adding process for matrix sub-groups in each of banks included in a memory system according to an embodiment of the present disclosure.

FIG. 10 is a schematic view illustrating an example of a column address adding process for the matrix sub-groups SG in the bank 111 of FIG. 5. Referring to FIG. 10, in an example of the data access to the first matrix group MG0 of the first memory chip (CHIP0), the column address additive value of "+32" may be added to the input column address for the matrices "0-7" and "120-127" constituting the first matrix sub-group SG0 among the matrices of a selected bank in the first memory chip (CHIP0). Thus, a column address of a memory cell accessed in each of the matrices "0-7" and "120-127" constituting the first matrix sub-group SG0 may be changed by "+32" from the input column address. Because the addition to the column address is executed in units of the matrix sub-groups SG, the column addresses for the matrices "0-7" and "120-127" constituting the first matrix sub-group SG0 may be changed by the same increment.

The column address variation for the matrices constituting each of the remaining matrix sub-groups (i.e., the second to eighth matrix sub-groups SG1~SG7) may occur to be similar to the column address variation for the matrices constituting the first matrix sub-group SG0. For example, the column address additive value of "+256" may be added to the input column address for the matrices constituting the eighth matrix sub-group SG7 (i.e., the matrices "56-63" in the left bank BANK_L and the matrices "64-71" in the right bank BANK_R which are accessed through the eighth data I/O terminal DQ7). Thus, a column address of memory cells accessed in each of the matrices "56-71" constituting the eighth matrix sub-group SG7 may be changed by a value of "+256" from the input column address. Even in such a case, because the addition to the column address is executed in units of the matrix sub-groups SG, the column addresses for the matrices "56-71" constituting the eighth matrix sub-group SG7 may be changed by the same increment. The column address variation for each of the remaining memory chips (i.e., the second to eighth memory chips CHIP1~CHIP7) may also occur in units of the matrix sub-groups by the column address additive values illustrated in FIG. 9.

Figure 11:
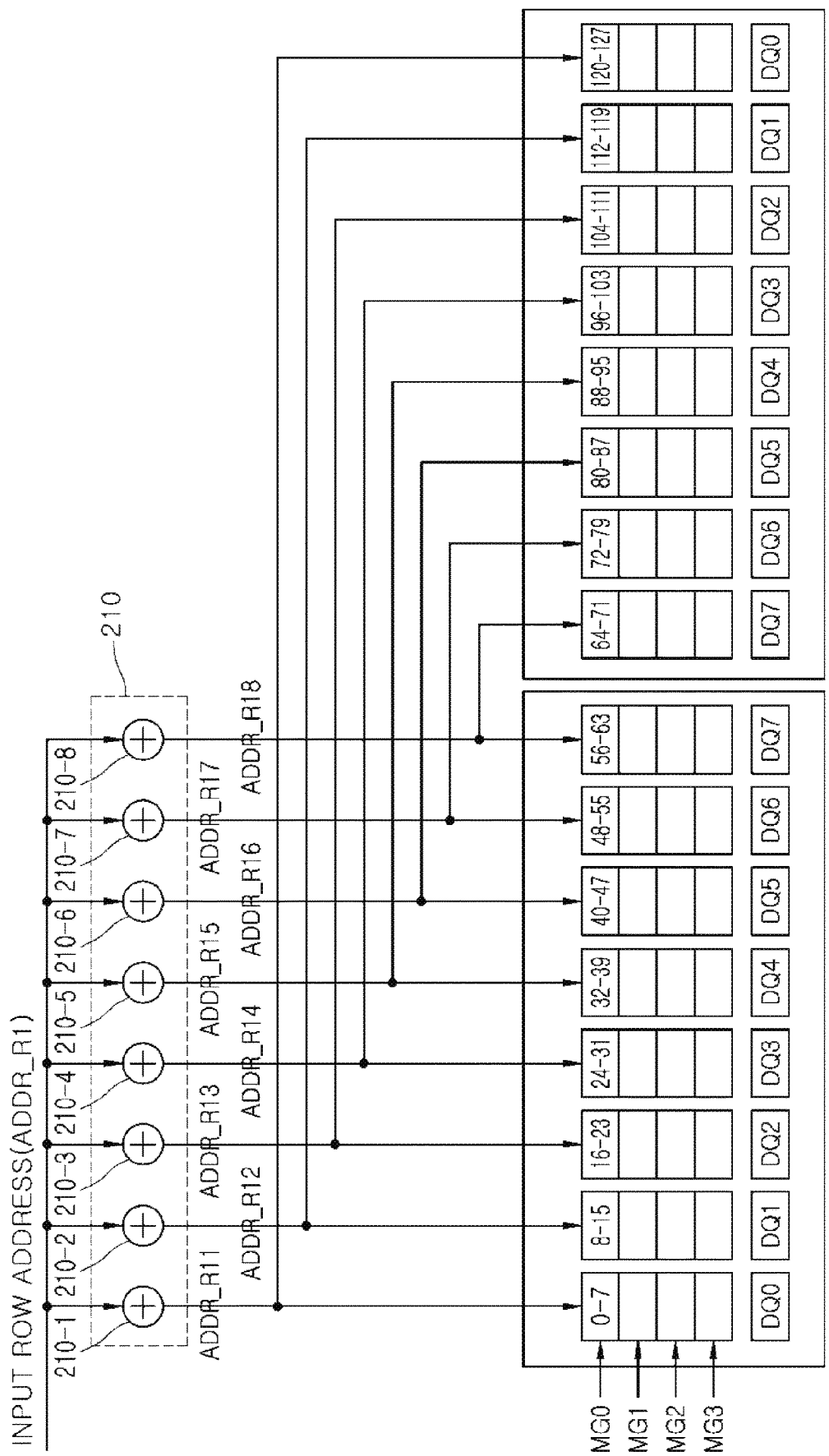
FIG. 11 illustrates an example of a row address adding circuit of a memory system according to an embodiment of the present disclosure.
Figure 12:
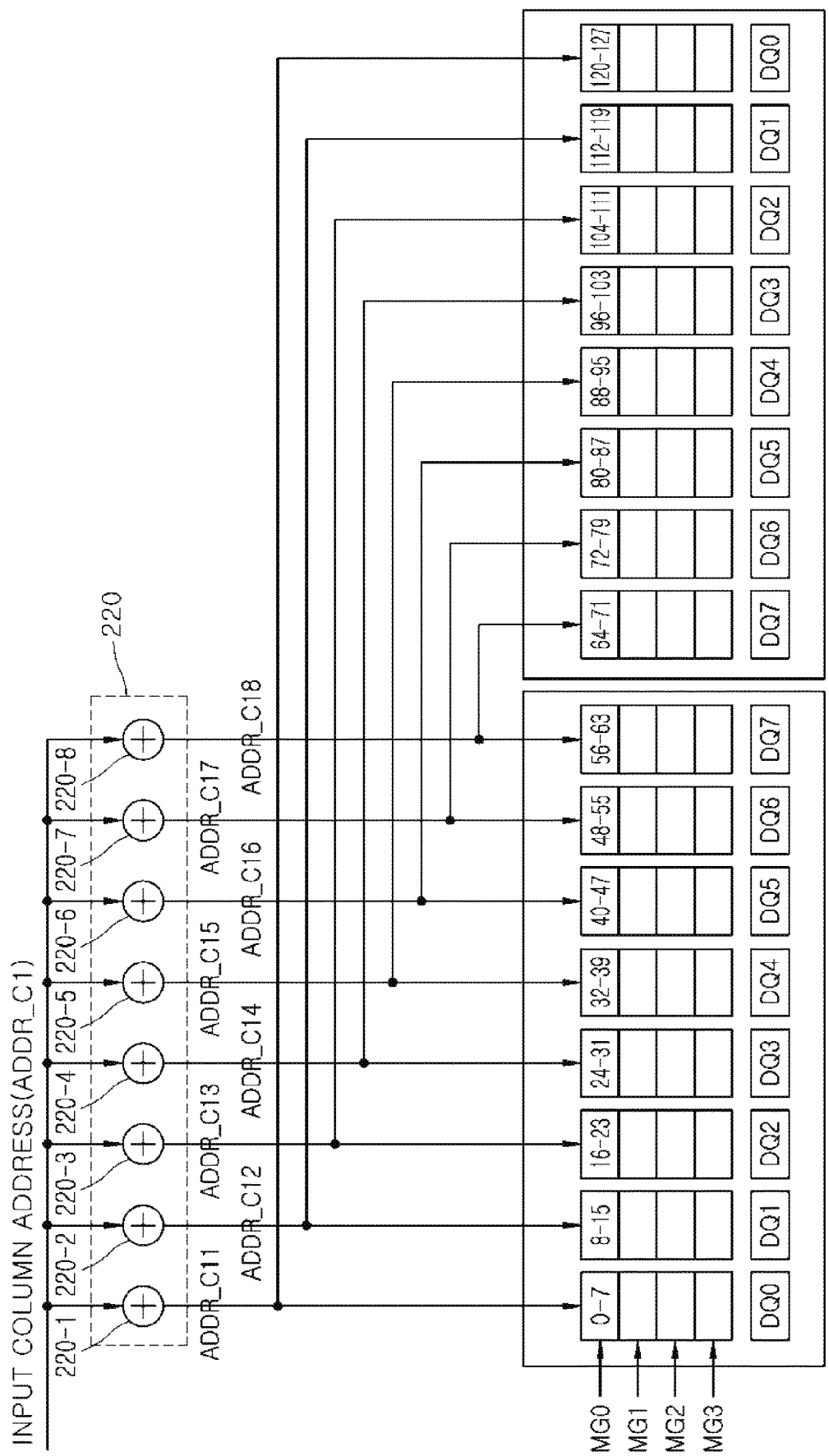
FIG. 12 illustrates an example of a column address adding circuit of a memory system according to an embodiment of the present disclosure.

FIGS. 11 and 12 illustrate examples of a row address adding circuit 210 and a column address adding circuit 220 of a memory system according to an embodiment of the present disclosure, respectively. First, referring to FIG. 11, the memory system according to an embodiment may include the row address adding circuit 210. The row address adding circuit 210 may be configured to include a plurality of row address adders, for example, first to eighth row address adders 210-1, . . . and 210-8. The first to eighth row address adders 210-1, . . . and 210-8 may receive an input row address ADDR_R1 in common. The first row address adder 210-1 may add a first row additive value (e.g., "+64") to the input row address ADDR_R1 and may output the result of the addition as a first row address ADDR_R11. The first row address ADDR_R11 outputted from the first row address adder 210-1 may be inputted to all of the matrices constituting the first matrix sub-group SG0. Thus, memory cells having the first row address ADDR_R11 corresponding to the changed row address may be selected in the matrices (i.e., the matrices "0-7" and "120-127" accessed through the first data I/O terminal DQ0) constituting the first matrix sub-group SG0 of the first matrix group MG0. In case of the present embodiment, because the first row address adder 210-1 adds a value of "+64" to the input row address ADDR_R1, the memory cells selected in the matrices "0-7" and "120-127" accessed through the first data I/O terminal DQ0 may have the first row address ADDR_R11 which is increased by "+64" from the input row address ADDR_R1.

The second row address adder 210-2 may add a second row additive value (e.g., "+128") to the input row address ADDR_R1 and may output the result of the addition as a second row address ADDR_R12. The second row address ADDR_R12 outputted from the second row address adder 210-2 may be inputted to all of the matrices constituting the second matrix sub-group SG1. Thus, memory cells having the second row address ADDR_R12 corresponding to the changed row address may be selected in the matrices (i.e., the matrices "8-15" and "112-119" accessed through the second data I/O terminal DQ1) constituting the second matrix sub-group SG1 of the first matrix group MG0. In case of the present embodiment, because the second row address adder 210-2 adds a value of "+128" to the input row address ADDR_R1, the memory cells selected in the matrices "8-15" and "112-119" accessed through the second data I/O terminal DQ1 may have the second row address ADDR_R12 which is increased by "+128" from the input row address ADDR_R1.

The third row address adder 210-3 may add a third row additive value (e.g., "+192") to the input row address ADDR_R1 and may output the result of the addition as a third row address ADDR_R13. The third row address ADDR_R13 outputted from the third row address adder 210-3 may be inputted to all of the matrices constituting the third matrix sub-group SG2. Thus, memory cells having the third row address ADDR_R13 corresponding to the changed row address may be selected in the matrices (i.e., the matrices "16-23" and "104-111" accessed through the third data I/O terminal DQ2) constituting the third matrix sub-group SG2 of the first matrix group MG0. In case of the present embodiment, because the third row address adder 210-3 adds a value of "+192" to the input row address ADDR_R1, the memory cells selected in the matrices "16-23" and "104-111" accessed through the third data I/O terminal DQ2 may have the third row address ADDR_R13 which is increased by "+192" from the input row address ADDR_R1.

The fourth row address adder 210-4 may add a fourth row additive value (e.g., "+256") to the input row address ADDR_R1 and may output the result of the addition as a fourth row address ADDR_R14. The fourth row address ADDR_R14 outputted from the fourth row address adder 210-4 may be inputted to all of the matrices constituting the fourth matrix sub-group SG3. Thus, memory cells having the fourth row address ADDR_R14 corresponding to the changed row address may be selected in the matrices (i.e., the matrices "24-31" and "96-103" accessed through the fourth data I/O terminal DQ3) constituting the fourth matrix sub-group SG3 of the first matrix group MG0. In case of the present embodiment, because the fourth row address adder 210-4 adds a value of "+256" to the input row address ADDR_R1, the memory cells selected in the matrices "24-31" and "96-103" accessed through the fourth data I/O terminal DQ3 may have the fourth row address ADDR_R14 which is increased by "+256" from the input row address ADDR_R1.

The fifth row address adder 210-5 may add a fifth row additive value (e.g., "+320") to the input row address ADDR_R1 and may output the result of the addition as a fifth row address ADDR_R15. The fifth row address ADDR_R15 outputted from the fifth row address adder 210-5 may be inputted to all of the matrices constituting the fifth matrix sub-group SG4. Thus, memory cells having the fifth row address ADDR_R15 corresponding to the changed row address may be selected in the matrices (i.e., the matrices "32-39" and "88-95" accessed through the fifth data I/O terminal DQ4) constituting the fifth matrix sub-group SG4 of the first matrix group MG0. In case of the present embodiment, because the fifth row address adder 210-5 adds a value of "+320" to the input row address ADDR_R1, the memory cells selected in the matrices "32-39" and "88-95" accessed through the fifth data I/O terminal DQ4 may have the fifth row address ADDR_R15 which is increased by "+320" from the input row address ADDR_R1.

The sixth row address adder 210-6 may add a sixth row additive value (e.g., "+384") to the input row address ADDR_R1 and may output the result of the addition as a sixth row address ADDR_R16. The sixth row address ADDR_R16 outputted from the sixth row address adder 210-6 may be inputted to all of the matrices constituting the sixth matrix sub-group SG5. Thus, memory cells having the sixth row address ADDR_R16 corresponding to the changed row address may be selected in the matrices (i.e., the matrices "40-47" and "80-87" accessed through the sixth data I/O terminal DQ5) constituting the sixth matrix sub-group SG5 of the first matrix group MG0. In case of the present embodiment, because the sixth row address adder 210-6 adds a value of "+384" to the input row address ADDR_R1, the memory cells selected in the matrices "40-47" and "80-87" accessed through the sixth data I/O terminal DQ5 may have the sixth row address ADDR_R16 which is increased by "+384" from the input row address ADDR_R1.

The seventh row address adder 210-7 may add a seventh row additive value (e.g., "+448") to the input row address ADDR_R1 and may output the result of the addition as a seventh row address ADDR_R17. The seventh row address ADDR_R17 outputted from the seventh row address adder 210-7 may be inputted to all of the matrices constituting the seventh matrix sub-group SG6. Thus, memory cells having the seventh row address ADDR_R17 corresponding to the changed row address may be selected in the matrices (i.e., the matrices "48-55" and "72-79" accessed through the seventh data I/O terminal DQ6) constituting the seventh matrix sub-group SG6 of the first matrix group MG0. In case of the present embodiment, because the seventh row address adder 210-7 adds a value of "+448" to the input row address ADDR_R1, the memory cells selected in the matrices "48-55" and "72-79" accessed through the seventh data I/O terminal DQ6 may have the seventh row address ADDR_R17 which is increased by "+448" from the input row address ADDR_R1.

The eighth row address adder 210-8 may add an eighth row additive value (e.g., "+512") to the input row address ADDR_R1 and may output the result of the addition as an eighth row address ADDR_R18. The eighth row address ADDR_R18 outputted from the eighth row address adder 210-8 may be inputted to all of the matrices constituting the eighth matrix sub-group SG7. Thus, memory cells having the eighth row address ADDR_R18 corresponding to the changed row address may be selected in the matrices (i.e., the matrices "56-71" accessed through the eighth data I/O terminal DQ7) constituting the eighth matrix sub-group SG7 of the first matrix group MG0. In case of the present embodiment, because the eighth row address adder 210-8 adds a value of "+512" to the input row address ADDR_R1, the memory cells selected in the matrices "56-71" accessed through the eighth data I/O terminal DQ7 may have the eighth row address ADDR_R18 which is increased by "+512" from the input row address ADDR_R1.

Next, referring to FIG. 12, the memory system according to an embodiment may include the column address adding circuit 220. The column address adding circuit 220 may be configured to include a plurality of column address adders, for example, first to eighth column address adders 220-1 . . . and 220-8. The first to eighth column address adders 220-1 . . . and 220-8 may receive an input column address ADDR_C1 in common. The first column address adder 220-1 may add a first column additive value (e.g., "+32") to the input column address ADDR_C1 and may output the result of the addition as a first column address ADDR_C11. The first column address ADDR_C11 outputted from the first column address adder 220-1 may be inputted to all of the matrices constituting the first matrix sub-group SG0. Thus, memory cells having the first column address ADDR_C11 corresponding to the changed column address may be selected in the matrices (i.e., the matrices "0-7" and "120-127" accessed through the first data I/O terminal DQ0) constituting the first matrix sub-group SG0 of the first matrix group MG0. In case of the present embodiment, because the first column address adder 220-1 adds a value of "+32" to the input column address ADDR_C1, the memory cells selected in the matrices "0-7" and "120-127" accessed through the first data I/O terminal DQ0 may have the first column address ADDR_C11 which is increased by "+32" from the input column address ADDR_C1.

The second column address adder 220-2 may add a second column additive value (e.g., "+64") to the input column address ADDR_C1 and may output the result of the addition as a second column address ADDR_C12. The second column address ADDR_C12 outputted from the second column address adder 220-2 may be inputted to all of the matrices constituting the second matrix sub-group SG1. Thus, memory cells having the second column address ADDR_C12 corresponding to the changed column address may be selected in the matrices (i.e., the matrices "8-15" and "112-119" accessed through the second data I/O terminal DQ1) constituting the second matrix sub-group SG1 of the first matrix group MG0. In case of the present embodiment, because the second column address adder 220-2 adds a value of "+64" to the input column address ADDR_C1, the memory cells selected in the matrices "8-15" and "112-119" accessed through the second data I/O terminal DQ1 may have the second column address ADDR_C12 which is increased by "+64" from the input column address ADDR_C1.

The third column address adder 220-3 may add a third column additive value (e.g., "+96") to the input column address ADDR_C1 and may output the result of the addition as a third column address ADDR_C13. The third column address ADDR_C13 outputted from the third column address adder 220-3 may be inputted to all of the matrices constituting the third matrix sub-group SG2. Thus, memory cells having the third column address ADDR_C13 corresponding to the changed column address may be selected in the matrices (i.e., the matrices "16-23" and "104-111" accessed through the third data I/O terminal DQ2) constituting the third matrix sub-group SG2 of the first matrix group MG0. In case of the present embodiment, because the third column address adder 220-3 adds a value of "+96" to the input column address ADDR_C1, the memory cells selected in the matrices "16-23" and "104-111" accessed through the third data I/O terminal DQ2 may have the third column address ADDR_C13 which is increased by "+96" from the input column address ADDR_C1.

The fourth column address adder 220-4 may add a fourth column additive value (e.g., "+128") to the input column address ADDR_C1 and may output the result of the addition as a fourth column address ADDR_C14. The fourth column address ADDR_C14 outputted from the fourth column address adder 220-4 may be inputted to all of the matrices constituting the fourth matrix sub-group SG3. Thus, memory cells having the fourth column address ADDR_C14 corresponding to the changed column address may be selected in the matrices (i.e., the matrices "24-31" and "96-103" accessed through the fourth data I/O terminal DQ3) constituting the fourth matrix sub-group SG3 of the first matrix group MG0. In case of the present embodiment, because the fourth column address adder 220-4 adds a value of "+128" to the input column address ADDR_C1, the memory cells selected in the matrices "24-31" and "96-103" accessed through the fourth data I/O terminal DQ3 may have the fourth column address ADDR_C14 which is increased by "+128" from the input column address ADDR_C1.

The fifth column address adder 220-5 may add a fifth column additive value (e.g., "+160") to the input column address ADDR_C1 and may output the result of the addition as a fifth column address ADDR_C15. The fifth column address ADDR_C15 outputted from the fifth column address adder 220-5 may be inputted to all of the matrices constituting the fifth matrix sub-group SG4. Thus, memory cells having the fifth column address ADDR_C15 corresponding to the changed column address may be selected in the matrices (i.e., the matrices "32-39" and "88-95" accessed through the fifth data I/O terminal DQ4) constituting the fifth matrix sub-group SG4 of the first matrix group MG0. In case of the present embodiment, because the fifth column address adder 220-5 adds a value of "+160" to the input column address ADDR_C1, the memory cells selected in the matrices "32-39" and "88-95" accessed through the fifth data I/O terminal DQ4 may have the fifth column address ADDR_C15 which is increased by "+160" from the input column address ADDR_C1.

The sixth column address adder 220-6 may add a sixth column additive value (e.g., "+192") to the input column address ADDR_C1 and may output the result of the addition as a sixth column address ADDR_C16. The sixth column address ADDR_C16 outputted from the sixth column address adder 220-6 may be inputted to all of the matrices constituting the sixth matrix sub-group SG5. Thus, memory cells having the sixth column address ADDR_C16 corresponding to the changed column address may be selected in the matrices (i.e., the matrices "40-47" and "80-87" accessed through the sixth data I/O terminal DQ5) constituting the sixth matrix sub-group SG5 of the first matrix group MG0. In case of the present embodiment, because the sixth column address adder 220-6 adds a value of "+192" to the input column address ADDR_C1, the memory cells selected in the matrices "40-47" and "80-87" accessed through the sixth data I/O terminal DQ5 may have the sixth column address ADDR_C16 which is increased by "+192" from the input column address ADDR_C1.

The seventh column address adder 220-7 may add a seventh column additive value (e.g., "+224") to the input column address ADDR_C1 and may output the result of the addition as a seventh column address ADDR_C17. The seventh column address ADDR_C17 outputted from the seventh column address adder 220-7 may be inputted to all of the matrices constituting the seventh matrix sub-group SG6. Thus, memory cells having the seventh column address ADDR_C17 corresponding to the changed column address may be selected in the matrices (i.e., the matrices "48-55" and "72-79" accessed through the seventh data I/O terminal DQ6) constituting the seventh matrix sub-group SG6 of the first matrix group MG0. In case of the present embodiment, because the seventh column address adder 220-7 adds a value of "+224" to the input column address ADDR_C1, the memory cells selected in the matrices "48-55" and "72-79" accessed through the seventh data I/O terminal DQ6 may have the seventh column address ADDR_C17 which is increased by "+224" from the input column address ADDR_C1.

The eighth column address adder 220-8 may add an eighth column additive value (e.g., "+256") to the input column address ADDR_C1 and may output the result of the addition as an eighth column address ADDR_C18. The eighth column address ADDR_C18 outputted from the eighth column address adder 220-8 may be inputted to all of the matrices constituting the eighth matrix sub-group SG7. Thus, memory cells having the eighth column address ADDR_C18 corresponding to the changed column address may be selected in the matrices (i.e., the matrices "56-71" accessed through the eighth data I/O terminal DQ7) constituting the eighth matrix sub-group SG7 of the first matrix group MG0. In case of the present embodiment, because the eighth column address adder 220-8 adds a value of "+256" to the input column address ADDR_C1, the memory cells selected in the matrices "56-71" accessed through the eighth data I/O terminal DQ7 may have the eighth column address ADDR_C18 which is increased by "+256" from the input column address ADDR_C1.

As described above with reference to FIGS. 11 and 12, memory cells having the first row address ADDR_R11 generated by adding the first row address additive value (e.g., a value of "+64") to the input row address ADDR_R1 and the first column address ADDR_C11 generated by adding the first column address additive value (e.g., a value of "+32") to the input column address ADDR_C1 may be selected in the matrices constituting the first matrix sub-group SG0. Similarly, memory cells having the second row address ADDR_R12 generated by adding the second row address additive value (e.g., a value of "+128") to the input row address ADDR_R1 and the second column address ADDR_C12 generated by adding the second column address additive value (e.g., a value of "+64") to the input column address ADDR_C1 may be selected in the matrices constituting the second matrix sub-group SG1. Thus, the memory cells selected in the matrices constituting the second matrix sub-group SG1 may have a row address increased by "+64" and a column address increased by "+32" as compared with the memory cells selected in the matrices constituting the first matrix sub-group SG0. That is, memory cells selected in the matrices constituting an $L^{th}$ matrix sub-group may have a row address increased by "+64" and a column address increased by "+32" as compared with memory cells selected in the matrices constituting a $(L-1)^{th}$ matrix sub-group (where "L" is a natural number which is equal to or greater than two).

Figure 13:
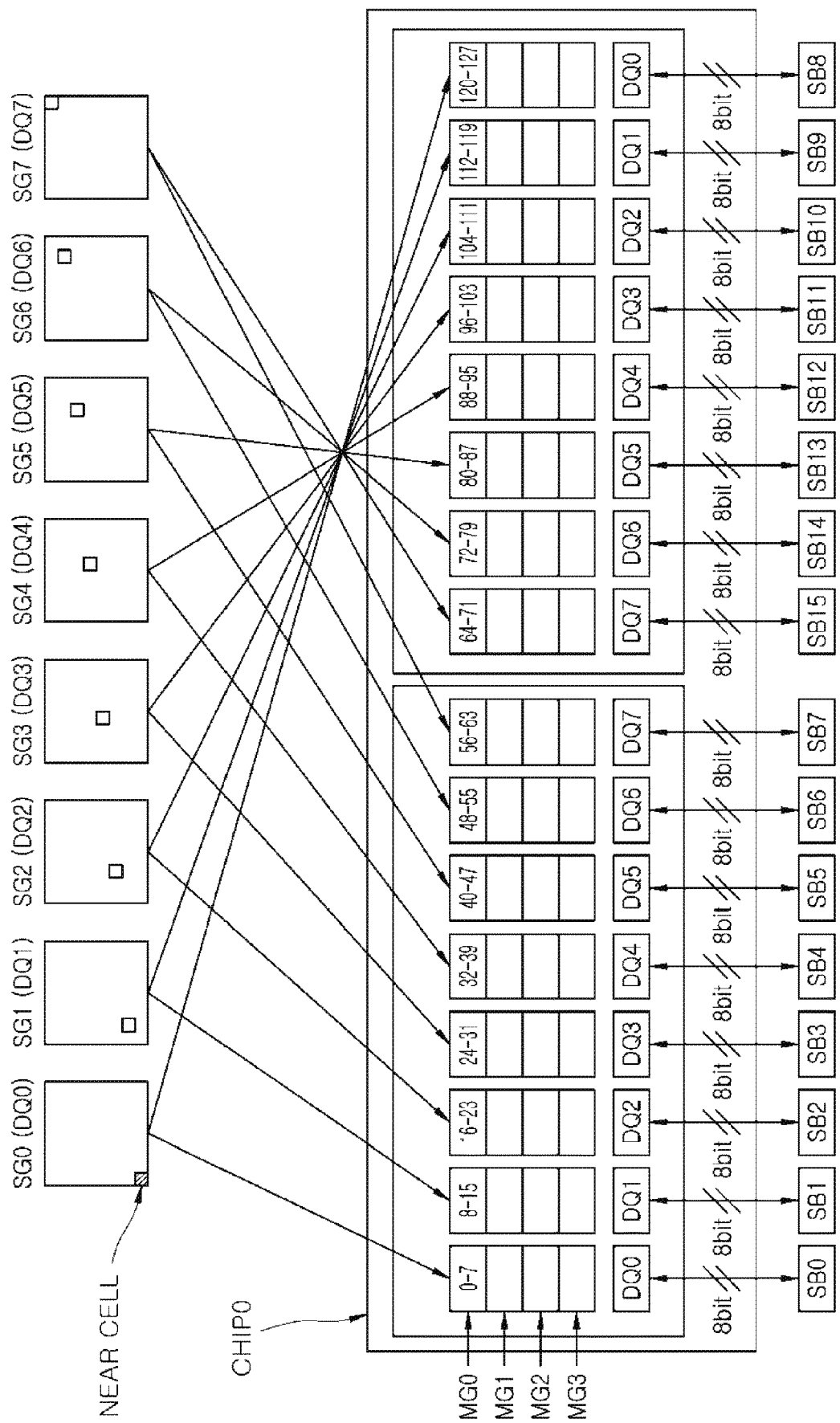
FIG. 13 is a schematic view illustrating an example of distribution of selected memory cells in matrix sub-groups of a memory chip included in a memory system according to an embodiment of the present disclosure.

FIG. 13 is a schematic view illustrating an example of distribution of memory cells selected in the matrix sub-groups SG of the first memory chip (CHIP0) included in a memory system according to an embodiment of the present disclosure. Referring to FIG. 13, locations of memory cells accessed (i.e., selected) in matrices may be different from each other according to the matrix sub-groups SG. For example, even though the memory cells selected in the matrices constituting the first matrix sub-group SG0 (i.e., the matrices "0-7" and "120-127" belonging to the first matrix sub-group SG0 of the first matrix group MG0) correspond to the near cells, the memory cells selected in the matrices belonging to the second to eighth matrix sub-groups SG1~SG7 may be located not to be the near cells. That is, because the memory cells accessed in the matrices "8-15" and "112-119" constituting the second matrix sub-group SG1 have the second row address ADDR_R12 increased by "+64" and the second column address ADDR_C12 increased by "+32" as compared with the memory cells accessed in the matrices "0-7" and "120-127" constituting the first matrix sub-group SG0, the memory cells accessed in the matrices "8-15" and "112-119" constituting the second matrix sub-group SG1 may be located at positions spaced apart from the near cells by a row address of "+64" and a column address of "+32". Similarly, because the memory cells accessed in the matrices "16-23" and "104-111" constituting the third matrix sub-group SG2 have the third row address ADDR_R13 increased by "+128" and the third column address ADDR_C13 increased by "+64" as compared with the memory cells accessed in the matrices "0-7" and "120-127" constituting the first matrix sub-group SG0, the memory cells accessed in the matrices "16-23" and "104-111" constituting the third matrix sub-group SG2 may be located at positions spaced apart from the near cells by a row address of "+128" and a column address of "+64". Although the present embodiment is described in conjunction with a case that the memory cells accessed in the matrices "0-7" and "120-127" constituting the first matrix sub-group SG0 correspond to the near cells, the distribution of the memory cells accessed in all of the matrix sub-groups may be substantially the same as the present embodiment even when the memory cells accessed in any one of the second to eighth matrix sub-group SG1~SG7 correspond to the near cells.

Figure 14:
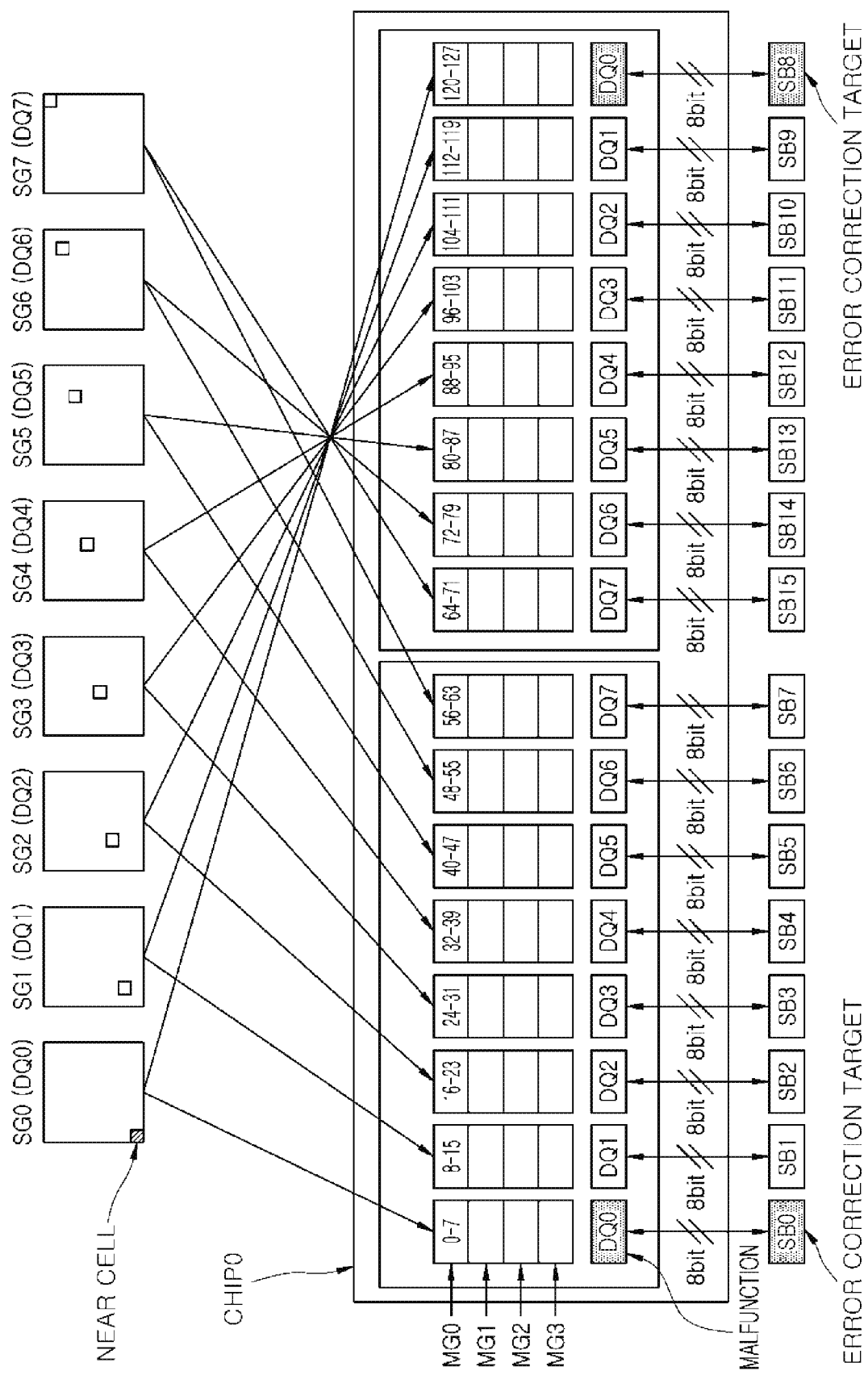
FIG. 14 is a schematic view illustrating an example of a reduced effect of the number of error correction target symbols in a memory system according to an embodiment of the present disclosure.

FIG. 14 is a schematic view illustrating a reduced effect of the number of error correction target symbols when an error occurs due to malfunction of the data I/O terminal DQ in a memory system according to an embodiment of the present disclosure. In FIG. 14, the same reference numerals or marks as used in FIG. 13 denote the same elements. Referring to FIG. 14, when the memory cells accessed in the matrices "0-7" and "120-127" constituting the first matrix sub-group SG0 of the first matrix group MG0 are the near cells, the error occurrence possibility may increase during the data access to the memory cells corresponding to the near cells. In the present embodiment, it may be assumed that errors occur during the data access to the memory cells corresponding to the near cells. In addition, it may be assumed that the first data I/O terminal DQ0 malfunctions as illustrated in FIG. 14. In such a case, errors of data transmitted through the first data I/O terminal DQ0 may include both of an error occurring due to the near cells and an error occurring due to the malfunction of the first data I/O terminal DQ0. Because the memory cells of the matrices "8-119" constituting the other matrix sub-groups SG1~SG7 do not correspond to the near cells, only the first symbol SB0 and the ninth symbol SB8 may become error correction targets. That is, because the data access to matrices of a certain matrix sub-group is executed through a certain data I/O terminal DQ, an error correction operation may be applied to only symbols comprised of data transmitted through the certain data I/O terminal DQ even though the memory cells of the matrices in the certain matrix sub-group are the near cells and the certain data I/O terminal DQ malfunctions.

Figure 15:
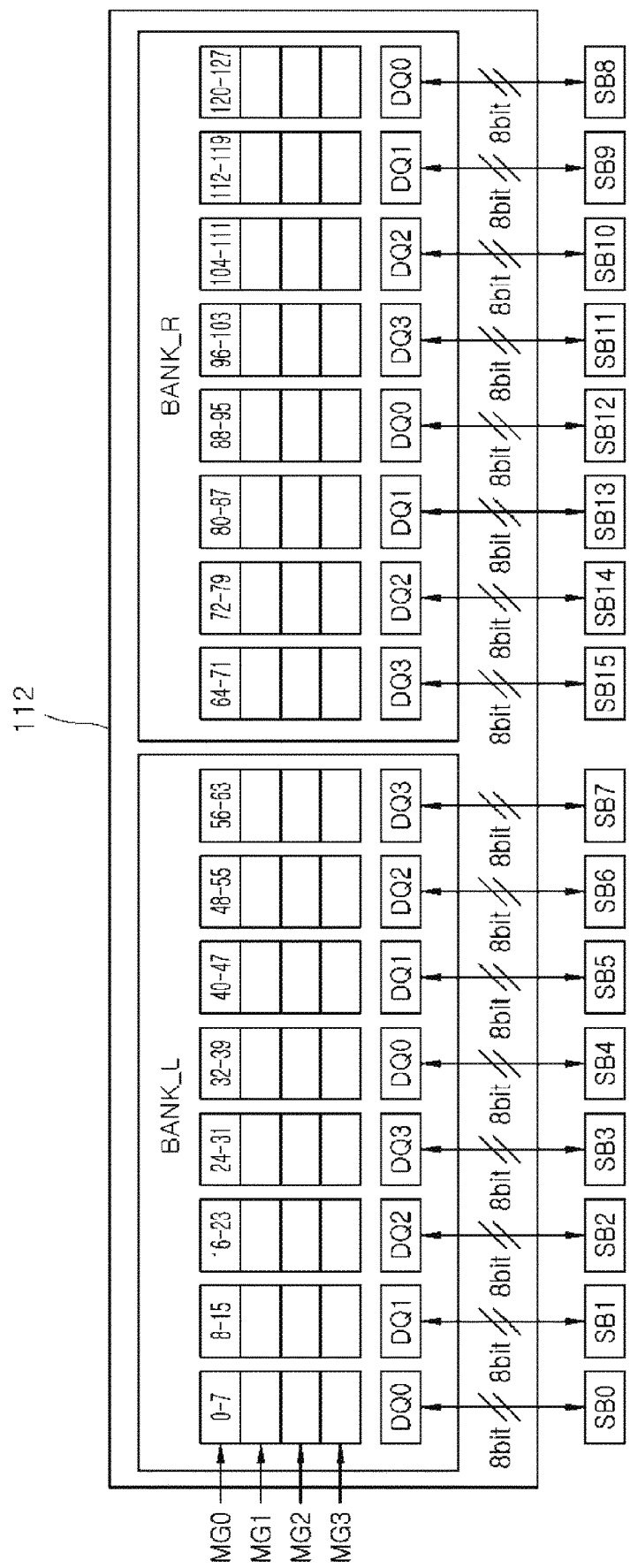
FIG. 15 is a schematic view illustrating another example of a bank of a memory chip included in a memory system according to an embodiment of the present disclosure.

FIG. 15 is a schematic view illustrating a bank 112 corresponding to another example of the bank 111 illustrated in FIG. 3. Referring to FIG. 15, the bank 112 may be different from the bank 111 described with reference to FIG. 3 in terms of the number of the data I/O terminals DQ. That is, while the bank 111 of FIG. 3 is configured to include eight data I/O terminals (i.e., the first to eighth data I/O terminals DQ0~DQ7), the bank 112 of FIG. 15 may be configured to include four data I/O terminals (i.e., first to fourth data I/O terminals DQ0~DQ3). The bank 112 may include a left bank BANK_L and a right bank BANK_R. Although each of the left bank BANK_L and the right bank BANK_R is illustrated as including the first to fourth data I/O terminals DQ0~DQ3 in some of the drawings, the drawings are merely illustrated for better understanding of the present disclosure. That is, the left bank BANK_L and the right bank BANK_R may physically share the first to fourth data I/O terminals DQ0~DQ3 with each other. The matrices MATs in each of the first to fourth matrix groups MG0~MG3 may be arrayed in units of 8 matrices, and the data access to the eight matrices may be executed through one of the first to fourth data I/O terminals DQ0~DQ3. For example, the data access to the first to eighth matrices "0-7" and the $33^{rd}$ to $40^{th}$ matrices "32-39" of the left bank BANK_L among the matrices MATs of the first matrix group MG0 may be executed through the first data I/O terminal DQ0. Thus, in the left bank BANK_L, the 8-bit data access to the $33^{rd}$ to $40^{th}$ matrices "32-39" may be executed through the first data I/O terminal DQ0 after the 8-bit data access to the first to eighth matrices "0-7" is executed through the first data I/O terminal DQ0. The data access to the ninth to sixteenth matrices "8-15" and the $41^{st}$ to $48^{th}$ matrices "40-47" of the left bank BANK_L among the matrices MATs of the first matrix group MG0 may be executed through the second data I/O terminal DQ1. In addition, the data access to the seventeenth to twenty fourth matrices "16-23" and the $49^{th}$ to $56^{th}$ matrices "48-55" of the left bank BANK_L among the matrices MATs of the first matrix group MG0 may be executed through the third data I/O terminal DQ2. Moreover, the data access to the $25^{th}$ to $32^{nd}$ matrices "24-31" and the $57^{th}$ to $64^{th}$ matrices "56-63" of the left bank BANK_L among the matrices MATs of the first matrix group MG0 may be executed through the fourth data I/O terminal DQ3.

The right bank BANK_R may be configured to be symmetric to the left bank BANK_L in terms of the data access executed through the first to fourth data I/O terminals DQ0~DQ3. In such a case, the data access to the $89^{th}$ to $96^{th}$ matrices "88-95" and the $121^{st}$ to $128^{th}$ matrices "120-127" of the right bank BANK_R among the matrices MATs of the first matrix group MG0 may be executed through the first data I/O terminal DQ0, and the data access to the $81^{st}$ to $88^{th}$ matrices "80-87" and the $113^{th}$ to $120^{th}$ matrices "112-119" of the right bank BANK_R among the matrices MATs of the first matrix group MG0 may be executed through the second data I/O terminal DQ1. Similarly, the data access to the $73^{rd}$ to $80^{th}$ matrices "72-79" and the $105^{th}$ to $112^{th}$ matrices "104-111" of the right bank BANK_R among the matrices MATs of the first matrix group MG0 may be executed through the third data I/O terminal DQ2, and the data access to the $65^{th}$ to $72^{nd}$ matrices "64-71" and the $97^{th}$ to $104^{th}$ matrices "96-103" of the right bank BANK_R among the matrices MATs of the first matrix group MG0 may be executed through the fourth data I/O terminal DQ3.

In the left bank BANK_L, 16-bit data may be transmitted through each of the first to fourth data I/O terminals DQ0~DQ3. Similarly, even in the right bank BANK_R, 16-bit data may be transmitted through each of the first to fourth data I/O terminals DQ0~DQ3. Thus, the data access to the bank 112 may be executed in units of 128 bits. In an embodiment, an error correction operation performed during the data access to the memory medium may be executed in units of symbols. One symbol may be configured to include 8-bit data. In such a case, because 128-bit data are simultaneously inputted to or outputted from the bank 112, first to sixteenth symbols SB0~SB15 may be generated by the bank 112. In addition, 32-bit data inputted to or outputted from the left and right banks BANK_L and BANK_R through one data I/O terminal DQ may constitute four symbols.

Because the number of data bits constituting one symbol is equal to the number of data bits transmitted through one data I/O terminal DQ, the symbols may be matched with the data I/O terminals in one to one. In an embodiment, 16-bit data inputted to or outputted from the left bank BANK_L through the first data I/O terminal DQ0 may constitute the first and fifth symbols SB0 and SB4, and 16-bit data inputted to or outputted from the left bank BANK_L through the second data I/O terminal DQ1 may constitute the second and sixth symbols SB1 and SB5. Moreover, 16-bit data inputted to or outputted from the left bank BANK_L through the third data I/O terminal DQ2 may constitute the third and seventh symbols SB2 and SB6, and 16-bit data inputted to or outputted from the left bank BANK_L through the fourth data I/O terminal DQ3 may constitute the fourth and eighth symbols SB3 and SB7. In the same way, the ninth to sixteenth symbols SB8~SB15 may be generated by the right bank BANK_R.

Figure 16:
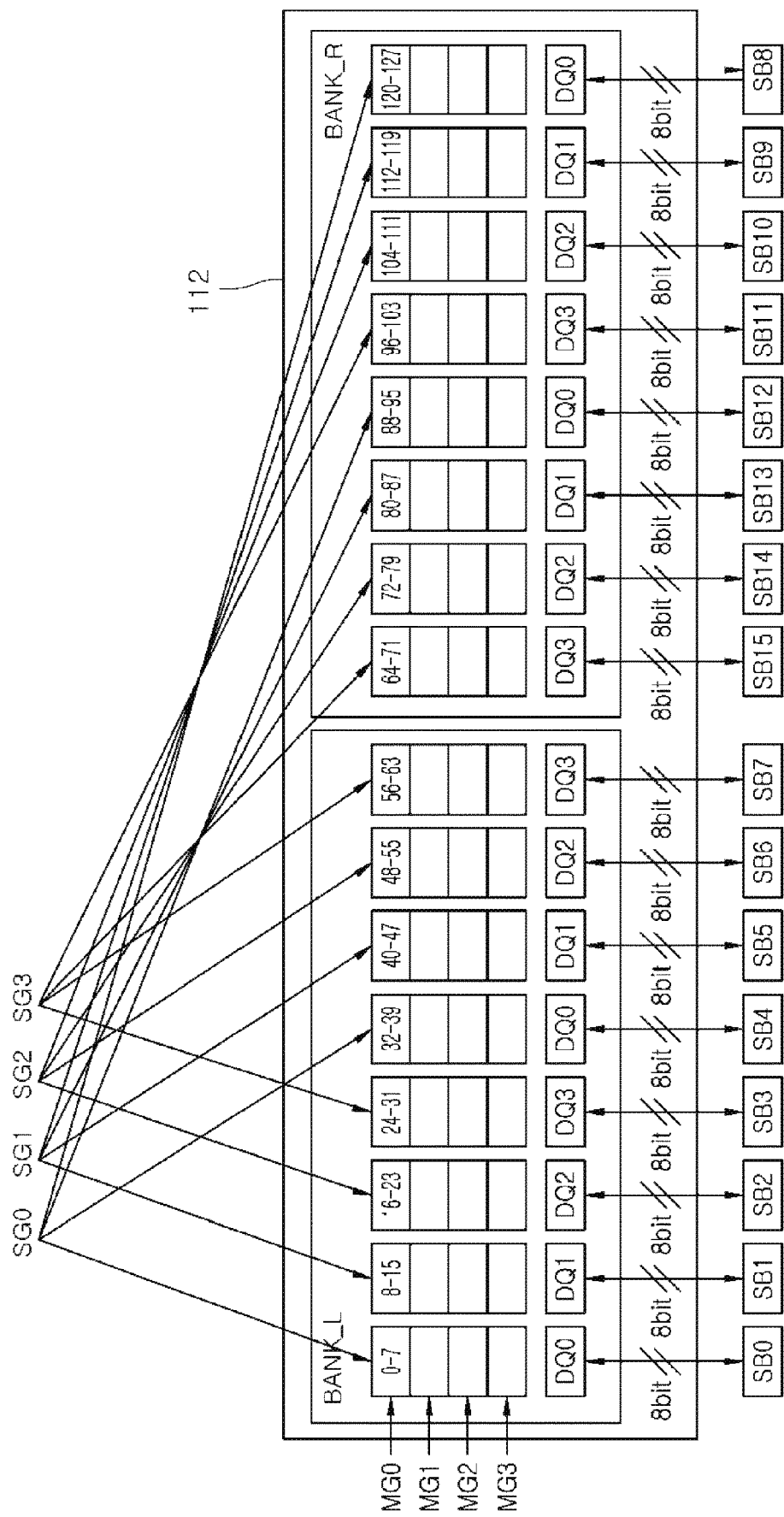
FIG. 16 is a schematic view illustrating another example of a matrix sub-grouping process of matrices included in a bank of a memory system according to an embodiment of the present disclosure.

FIG. 16 illustrates a sub-grouping process of the matrices in the bank 112 of FIG. 15. In FIG. 16, the same reference numerals and characters as used in FIG. 15 denote the same elements. Referring to FIG. 16, the matrices MATs (i.e., the first to $512^{th}$ matrices) constituting the bank 112 may be classified into a plurality of matrix sub-groups SG (i.e., first to fourth matrix sub-groups SG0~SG3). The matrices accessed by the same data I/O terminal DQ may belong to one of the first to fourth matrix sub-groups SG0~SG3. Thus, the number of the matrix sub-groups SG may be set to be equal to the number of the data I/O terminals DQ. In the present embodiment, because the number of the data I/O terminals DQ0~DQ3 is four, the number of the matrix sub-groups SG0~SG3 may also be four. For example, the first matrix sub-group SG0 may be configured to include the matrices sharing the first data I/O terminal DQ0 with each other in the left bank BANK_L and the right bank BANK_R. Thus, the first matrix sub-group SG0 may include the first to eighth matrices "0-7", the thirty third to fortieth matrices "32-39", the eighty ninth to ninety sixth matrices "88-95", and the one hundred and twenty first to one hundred and twenty eighth matrices "120-127" among the matrices of the first matrix group MG0. In addition, in the left bank BANK_L and the right bank BANK_R of each of the second to fourth matrix groups MG1~MG3, the first matrix sub-group SG0 may be configured to include the matrices sharing the first data I/O terminal DQ0 with each other. Thus, data inputted to or outputted from the matrices in the left bank BANK_L among the matrices belonging to the first matrix sub-group SG0 may constitute the first and fifth symbols SB0 and SB4, and data inputted to or outputted from the matrices in the right bank BANK_R among the matrices belonging to the first matrix sub-group SG0 may constitute the ninth and thirteenth symbols SB8 and SB12.

The second matrix sub-group SG1 may be configured to include the matrices sharing the second data I/O terminal DQ1 with each other in the left bank BANK_L and the right bank BANK_R. Thus, the second matrix sub-group SG1 may include the ninth to sixteenth matrices "8-15", the forty first to forty eighth matrices "40-47", the eighty first to eighty eighth matrices "80-87", and the one hundred and thirteenth to one hundred and twentieth matrices "112-119" among the matrices of the first matrix group MG0. In addition, in the left bank BANK_L and the right bank BANK_R of each of the second to fourth matrix groups MG1~MG3, the second matrix sub-group SG1 may be configured to include the matrices sharing the second data I/O terminal DQ1 with each other. Thus, data inputted to or outputted from the matrices in the left bank BANK_L among the matrices belonging to the second matrix sub-group SG1 may constitute the second and sixth symbols SB1 and SB5, and data inputted to or outputted from the matrices in the right bank BANK_R among the matrices belonging to the second matrix sub-group SG1 may constitute the tenth and fourteenth symbols SB9 and SB13.

The third matrix sub-group SG2 may be configured to include the matrices sharing the third data I/O terminal DQ2 with each other in the left bank BANK_L and the right bank BANK_R. Thus, the third matrix sub-group SG2 may include the seventeenth to twenty fourth matrices "16-23", the forty ninth to fifty sixth matrices "48-55", the seventy third to eightieth matrices "72-79", and the one hundred fifth to one hundred and twelfth matrices "104-111" among the matrices of the first matrix group MG0. In addition, in the left bank BANK_L and the right bank BANK_R of each of the second to fourth matrix groups MG1~MG3, the third matrix sub-group SG2 may be configured to include the matrices sharing the third data I/O terminal DQ2 with each other. Thus, data inputted to or outputted from the matrices in the left bank BANK_L among the matrices belonging to the third matrix sub-group SG2 may constitute the third and seventh symbols SB2 and SB6, and data inputted to or outputted from the matrices in the right bank BANK_R among the matrices belonging to the third matrix sub-group SG2 may constitute the eleventh and fifteenth symbols SB10 and SB14.

The fourth matrix sub-group SG3 may be configured to include the matrices sharing the fourth data I/O terminal DQ3 with each other in the left bank BANK_L and the right bank BANK_R. Thus, the fourth matrix sub-group SG3 may include the twenty fifth to thirty second matrices "24-31", the fifty seventh to sixty fourth matrices "56-63", the sixty fifth to seventy second matrices "64-71", and the ninety seventh to one hundred and fourth matrices "96-103" among the matrices of the first matrix group MG0. In addition, in the left bank BANK_L and the right bank BANK_R of each of the second to fourth matrix groups MG1~MG3, the fourth matrix sub-group SG3 may be configured to include the matrices sharing the fourth data I/O terminal DQ3 with each other. Thus, data inputted to or outputted from the matrices in the left bank BANK_L among the matrices belonging to the fourth matrix sub-group SG3 may constitute the fourth and eighth symbols SB3 and SB7, and data inputted to or outputted from the matrices in the right bank BANK_R among the matrices belonging to the fourth matrix sub-group SG3 may constitute the twelfth and sixteenth symbols SB11 and SB15.

FIG. 17 is a table illustrating distribution of the matrices allocated to the matrix sub-groups included in each (i.e., the memory chip 112) of the memory chips. Numerals described in the table of FIG. 17 denote matrix numbers allocated to the matrix sub-groups. Referring to FIG. 17, the matrices MATs belonging to each of the matrix groups in a bank of the first memory chip (CHIP0) 100-0 may be classified into the first to fourth matrix sub-groups SG0~SG3. For example, the first matrix sub-group SG0 of the first memory chip (CHIP0) may be configured to include the first to eighth matrices "0-7", the thirty third to fortieth matrices "32-39", the eighty ninth to ninety sixth matrices "88-95", and the one hundred and twenty first to one hundred and twenty eighth matrices "120-127". Although FIG. 17 illustrates only the distribution of the matrices for the matrix sub-groups SG0~SG3 in the first matrix group MG0, the matrices of the matrix sub-groups SG0~SG3 in each of the remaining matrix groups MG1~MG3 may also exhibit the same distribution as illustrated in FIG. 17. In addition, the matrices of each of the remaining banks in the first memory chip (CHIP0) 100-0 may also exhibit the same distribution as illustrated in FIG. 17.

The matrices MATs belonging to each of the matrix groups in the bank 112 of the second to eighth memory chips (CHIP1-CHIP7) may be classified into four sub-groups by the same way as described above. For example, the matrices MATs belonging to each of the matrix groups in a bank (i.e., the bank 112) of the eighth memory chip (CHIP7) 100-7 may be classified into twenty ninth to thirty second matrix sub-groups SG28~SG31. In such a case, the thirty second matrix sub-group SG31 of the eighth memory chip (CHIP7) 100-7 may be configured to include $921^{th}$ to $928^{th}$ matrices "920-927", $953^{th}$ to $960^{th}$ matrices "952-959", $961^{th}$ to $968^{th}$ matrices "960-967", and $993^{th}$ to $1000^{th}$ matrices "992-999". According to the configuration described above, when a memory medium is configured to include eight memory chips, each of which is comprised of a plurality of banks and the data excess to each of the banks is executed through four data I/O terminals, matrices accessed during a single data access process may be classified into thirty two matrix sub-groups (i.e., the first to thirty second matrix sub-groups SG0~SG31). Each of the matrix sub-groups may be configured to include thirty two matrices.

Figure 19:
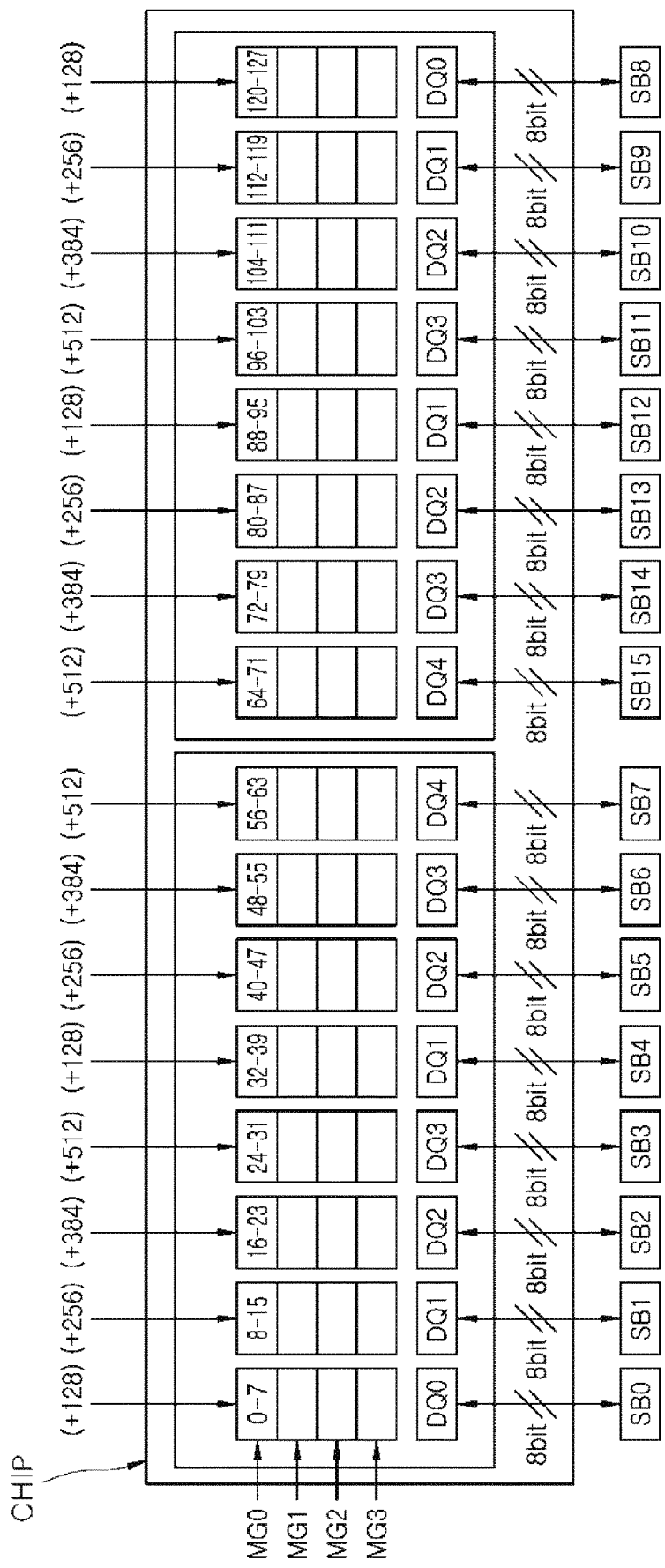
FIG. 19 is a schematic view illustrating another example of a row address adding process for matrix sub-groups in each of banks included in a memory system according to an embodiment of the present disclosure.

FIGS. 18 and 19 illustrate distribution of row addresses additive values for the matrix sub-groups SGs included in the banks, each of which corresponds to the bank 112 described with reference to FIGS. 15 and 16. First, referring to FIG. 18, the row address additive value may be added to row addresses inputted to the memory chips in units of matrix sub-groups SG for all of the matrices belonging to the first to thirty second matrix sub-groups SG0~SG31 included in the first to eighth memory chips CHIP0~CHIP7. The row address additive values may be set to have weighted values for the matrix sub-groups SG. That is, the first to thirty second matrix sub-groups SG0~SG31 may have the row address additive values which are different from each other. In an embodiment, the row address additive values of the first to thirty second matrix sub-groups SG0~SG31 may sequentially increase.

An increment of the row address additive values of the first to thirty second matrix sub-groups SG0~SG31 may be set to be different according to a cell array structure of each of the matrices MATs. When the cell array structure of the matrix MAT is designed to have 4096 row addresses and the number of the matrix sub-groups SG is 32, the increment of the row address additive values of the matrix sub-groups SG may be set as 128 such that the row addresses of all of the cell array structures are equally distributed in the 32 matrix sub-groups SG. Thus, the row address additive value of "+128" may be added to the input row address for the matrices "0-7", "32-39", "88-95" and "120-127" in the first matrix sub-group SG0 of the first memory chip (CHIP0), and the row address additive value of "+256" may be added to the input row address for the matrices "8-15", "40-47", "80-87" and "112-119" in the second matrix sub-group SG1 of the first memory chip (CHIP0). In addition, the row address additive value of "+384" may be added to the input row address for the matrices "16-23", "48-55", "72-79" and "104-111" in the third matrix sub-group SG2 of the first memory chip (CHIP0), and the row address additive value of "+512" may be added to the input row address for the matrices "24-31", "56-71" and "96-103" in the fourth matrix sub-group SG3 of the first memory chip (CHIP0).

In the same way as described above, the row address additive value of "+3712" may be added to the input row address for the matrices "896-903", "928-935", "984-991" and "1016-1023" in the first matrix sub-group (i.e., the twenty ninth matrix sub-group SG28) of the eighth memory chip (CHIP7), and the row address additive value of "+3840" may be added to the input row address for the matrices "904-911", "936-943", "976-983" and "1008-1015" in the second matrix sub-group (i.e., the thirtieth matrix sub-group SG29) of the eighth memory chip (CHIP7). In addition, the row address additive value of "+3968" may be added to the input row address for the matrices "912-919", "944-951", "968-975" and "1000-1007" in the third matrix sub-group (i.e., the thirty first matrix sub-group SG30) of the eighth memory chip (CHIP7), and the row address additive value of "+4096" may be added to the input row address for the matrices "920-927", "952-959", "960-967" and "992-999" in the fourth matrix sub-group (i.e., the thirty second matrix sub-group SG31) of the eighth memory chip (CHIP7). In this way, the row address additive values may be added to the input row address for the matrices of the second to seventh memory chips (CHIP1~CHIP6) in units of matrix sub-groups.

Next, referring to FIG. 19, in an example of the data access to the first matrix group MG0 of the first memory chip (CHIP0), the matrices "0-7" and "32-39" of the left bank BANK_L and the matrices "88-95" and "120-127" of the right bank BANK_R which are accessed through the first data I/O terminal DQ0 among the matrices of a selected bank in the first memory chip (CHIP0) may constitute the first matrix sub-group SG0. The row address additive value of "+128" may be added to the input row address for the matrices "0-7", "32-39", "88-95" and "120-127" constituting the first matrix sub-group SG0. Thus, a row address of a memory cell accessed in each of the matrices "0-7", "32-39", "88-95" and "120-127" constituting the first matrix sub-group SG0 may be changed by "+128" from the input row address. Because the addition to the row address is executed in units of the matrix sub-groups SG, the row addresses for the matrices "0-7", "32-39", "88-95" and "120-127" constituting the first matrix sub-group SG0 may be changed by the same increment.

The row address variation for the matrices constituting each of the remaining matrix sub-groups (i.e., the second to fourth matrix sub-groups SG1~SG3) may occur to be similar to the row address variation for the matrices constituting the first matrix sub-group SG0. For example, the row address additive value of "+512" may be added to the input row address for the matrices constituting the fourth matrix sub-group SG3 (i.e., the matrices "24-31" and "56-63" in the left bank BANK_L and the matrices "64-71" and "96-103" in the right bank BANK_R which are accessed through the fourth data I/O terminal DQ3). Thus, a row address of memory cells accessed in each of the matrices "24-31, "56-71" and "96-103" constituting the fourth matrix sub-group SG3 may be changed by a value of "+512" from the input row address. Even in such a case, because the addition to the row address is executed in units of the matrix sub-groups SG, the row addresses for the matrices "24-31, "56-71" and "96-103" constituting the fourth matrix sub-group SG3 may be changed by the same increment. The row address variation for each of the remaining memory chips (i.e., the second to eighth memory chips CHIP1~CHIP7) may also occur in units of the matrix sub-groups by the row address additive values illustrated in the table of FIG. 18.

Figure 21:
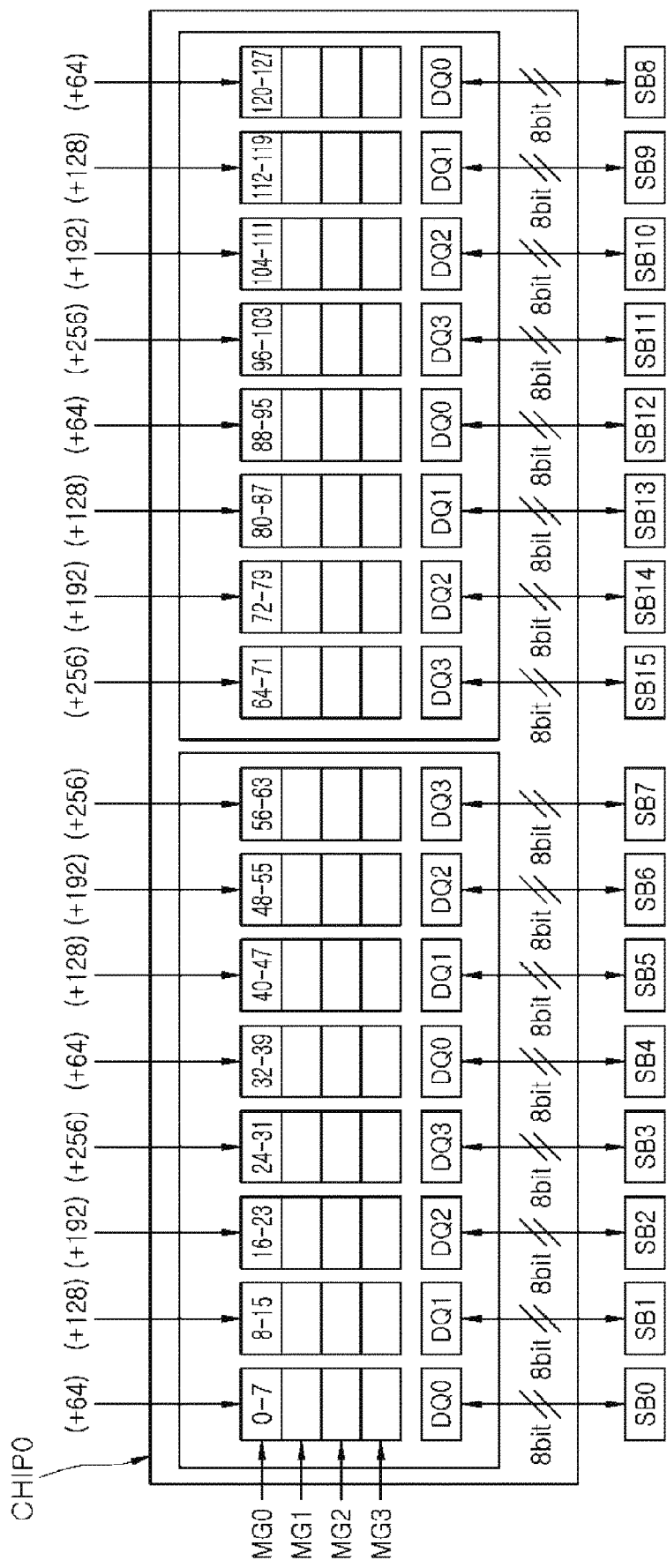
FIG. 21 is a schematic view illustrating another example of a column address adding process for matrix sub-groups in each of banks included in a memory system according to an embodiment of the present disclosure.

FIGS. 20 and 21 illustrate distribution of column addresses additive values for the matrix sub-groups SGs included in the banks, each of which corresponds to the bank 112 described with reference to FIGS. 15 and 16. First, referring to FIG. 20, the column address additive values may be added to column addresses inputted to the memory chips in units of matrix sub-groups SG for all of the matrices belonging to the first to thirty second matrix sub-groups SG0~SG31 included in the first to eighth memory chips CHIP0~CHIP7. The column address additive values may be set to have weighted values for the matrix sub-groups SG. That is, the first to thirty second matrix sub-groups SG0~SG31 may have the column address additive values which are different from each other. In an embodiment, the column address additive values of the first to thirty second matrix sub-groups SG0~SG31 may sequentially increase.

An increment of the column address additive values of the first to thirty second matrix sub-groups SG0~SG31 may be set to be different according to a cell array structure of each of the matrices MATs. When the cell array structure of the matrix MAT is designed to have 2048 column addresses and the number of the matrix sub-groups SG is 32, the increment of the column address additive values of the matrix sub-groups SG may be set as 64 such that the column addresses of all of the cell array structures are equally distributed in the 32 matrix sub-groups SG. Thus, the column address additive value of "+64" may be added to the input column address for the matrices "0-7", "32-39", "88-95" and "120-127" in the first matrix sub-group SG0 of the first memory chip (CHIP0), and the column address additive value of "+128" may be added to the input column address for the matrices "8-15", "40-47", "80-87" and "112-119" in the second matrix sub-group SG1 of the first memory chip (CHIP0). In addition, the column address additive value of "+192" may be added to the input column address for the matrices "16-23", "48-55", "72-79" and "104-111" in the third matrix sub-group SG2 of the first memory chip (CHIP0), and the column address additive value of "+256" may be added to the input column address for the matrices "24-31", "56-71" and "96-103" in the fourth matrix sub-group SG3 of the first memory chip (CHIP0).

In the same way as described above, the column address additive value of "+1856" may be added to the input column address for the matrices "896-903", "928-935", "984-991" and "1016-1023" in the first matrix sub-group (i.e., the twenty ninth matrix sub-group SG28) of the eighth memory chip (CHIP7), and the column address additive value of "+1920" may be added to the input column address for the matrices "904-911", "936-943", "976-983" and "1008-1015" in the second matrix sub-group (i.e., the thirtieth matrix sub-group SG29) of the eighth memory chip (CHIP7). In addition, the column address additive value of "+1984" may be added to the input column address for the matrices "912-919", "944-951", "968-975" and "1000-1007" in the third matrix sub-group (i.e., the thirty first matrix sub-group SG30) of the eighth memory chip (CHIP7), and the column address additive value of "+2048" may be added to the input column address for the matrices "920-927", "952-959", "960-967" and "992-999" in the fourth matrix sub-group (i.e., the thirty second matrix sub-group SG31) of the eighth memory chip (CHIP7). In this way, the column address additive values may be added to the input column address for the matrices of the second to seventh memory chips (CHIP1~CHIP6) in units of matrix sub-groups.

Next, referring to FIG. 21, in an example of the data access to the first matrix group MG0 of the first memory chip (CHIP0), the matrices "0-7" and "32-39" of the left bank BANK_L and the matrices "88-95" and "120-127" of the right bank BANK_R which are accessed through the first data I/O terminal DQ0 among the matrices of a selected bank in the first memory chip (CHIP0) may constitute the first matrix sub-group SG0. The column address additive value of "+64" may be added to the input column address for the matrices "0-7", "32-39", "88-95" and "120-127" constituting the first matrix sub-group SG0. Thus, a column address of a memory cell accessed in each of the matrices "0-7", "32-39", "88-95" and "120-127" constituting the first matrix sub-group SG0 may be changed by "+64" from the input column address. Because the addition to the column address is executed in units of the matrix sub-groups SG, the column addresses for the matrices "0-7", "32-39", "88-95" and "120-127" constituting the first matrix sub-group SG0 may be changed by the same increment.

The column address variation for the matrices constituting each of the remaining matrix sub-groups (i.e., the second to fourth matrix sub-groups SG1~SG3) may occur to be similar to the column address variation for the matrices constituting the first matrix sub-group SG0. For example, the column address additive value of "+256" may be added to the input column address for the matrices constituting the fourth matrix sub-group SG3 (i.e., the matrices "24-31" and "56-63" in the left bank BANK_L and the matrices "64-71" and "96-103" in the right bank BANK_R which are accessed through the fourth data I/O terminal DQ3). Thus, a column address of memory cells accessed in each of the matrices "24-31, "56-71" and "96-103" constituting the fourth matrix sub-group SG3 may be changed by a value of "+256" from the input column address. Even in such a case, because the addition to the column address is executed in units of the matrix sub-groups SG, the column addresses for the matrices "24-31, "56-71" and "96-103" constituting the fourth matrix sub-group SG3 may be changed by the same increment. The column address variation for each of the remaining memory chips (i.e., the second to eighth memory chips CHIP1~CHIP7) may also occur in units of the matrix sub-groups by the column address additive values illustrated in the table of FIG. 20.

Figure 22:
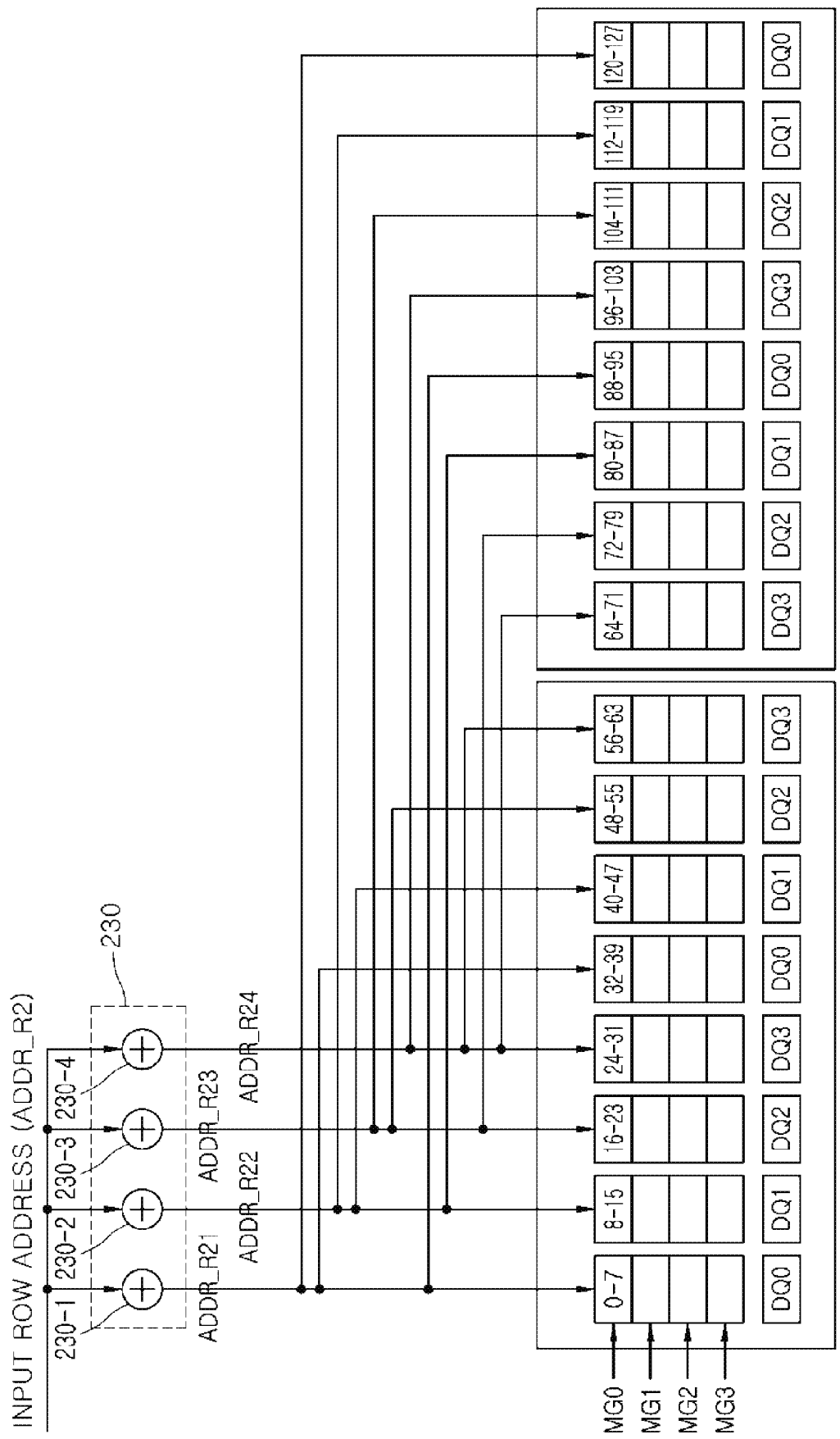
FIG. 22 illustrates another example of a row address adding circuit of a memory system according to an embodiment of the present disclosure.
Figure 23:
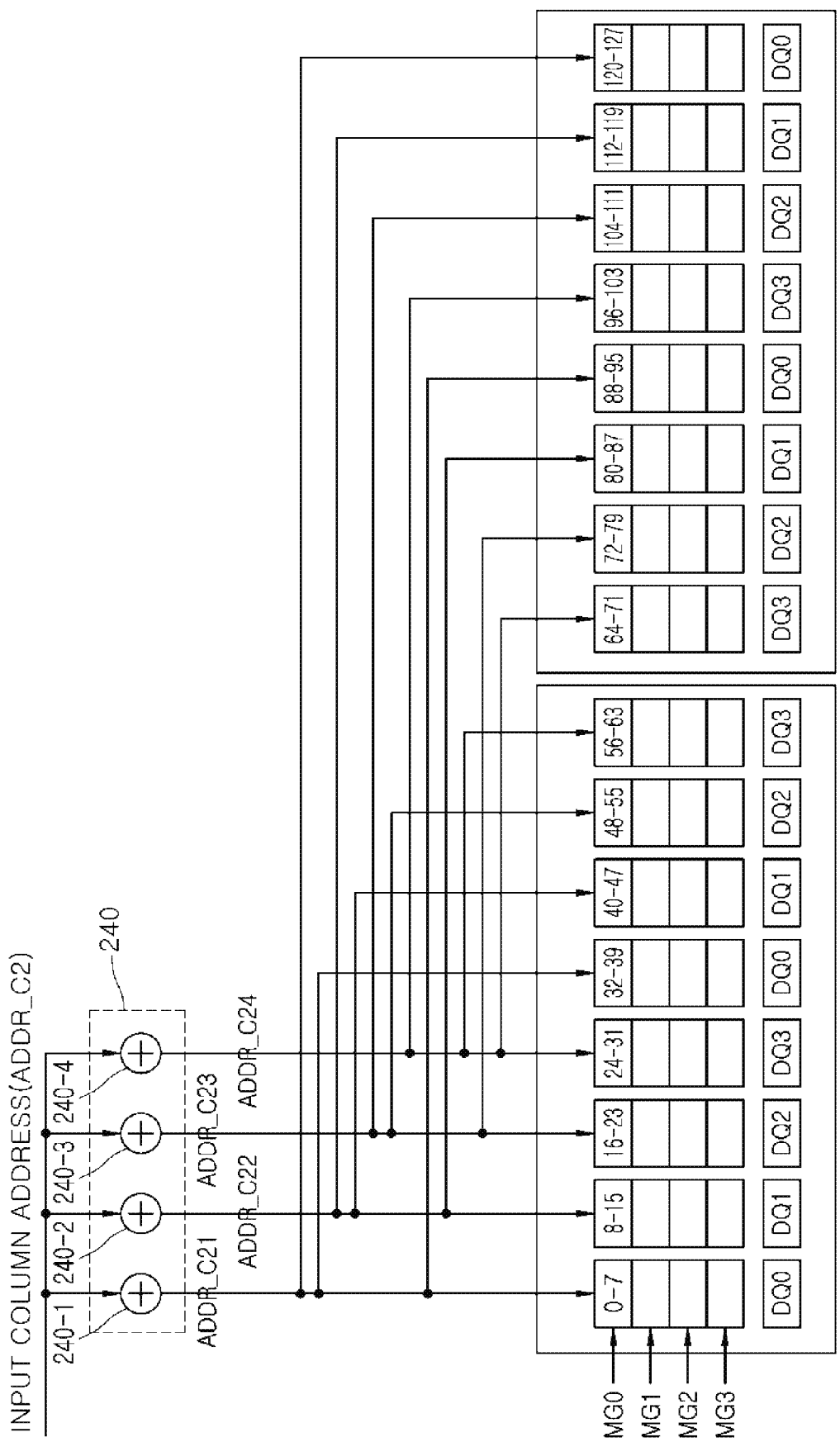
FIG. 23 illustrates another example of a column address adding circuit of a memory system according to an embodiment of the present disclosure.

FIGS. 22 and 23 illustrate configurations of a row address adding circuit 230 and a column address adding circuit 240 corresponding to other examples of the row address adding circuit 210 and the column address adding circuit 220 illustrated in FIGS. 11 and 12, respectively, together with the bank 112 described with reference to FIGS. 15 and 16. First, referring to FIG. 22, the memory system according to the present embodiment may include the row address adding circuit 230. The row address adding circuit 230 may be configured to include a plurality of row address adders, for example, first to fourth row address adders 230-1, . . . and 230-4. The first to fourth row address adders 230-1, . . . and 230-4 may receive an input row address ADDR_R2 in common. The first row address adder 230-1 may add a first row additive value (e.g., "+128") to the input row address ADDR_R2 and may output the result of the addition as a first row address ADDR_R21. The first row address ADDR_R21 outputted from the first row address adder 230-1 may be inputted to all of the matrices constituting the first matrix sub-group SG0. Thus, memory cells having the first row address ADDR_R21 corresponding to the changed row address may be selected in the matrices (i.e., the matrices "0-7", "32-39", "88-95" and "120-127" accessed through the first data I/O terminal DQ0) constituting the first matrix sub-group SG0 of the first matrix group MG0. In case of the present embodiment, because the first row address adder 230-1 adds a value of "+128" to the input row address ADDR_R2, the memory cells selected in the matrices "0-7", "32-39", "88-95" and "120-127" accessed through the first data I/O terminal DQ0 may have the first row address ADDR_R21 which is increased by "+128" from the input row address ADDR_R2.

The second row address adder 230-2 may add a second row additive value (e.g., "+256") to the input row address ADDR_R2 and may output the result of the addition as a second row address ADDR_R22. The second row address ADDR_R22 outputted from the second row address adder 230-2 may be inputted to all of the matrices constituting the second matrix sub-group SG1. Thus, memory cells having the second row address ADDR_R22 corresponding to the changed row address may be selected in the matrices (i.e., the matrices "8-15", "40-47", "80-87" and "112-119" accessed through the second data I/O terminal DQ1) constituting the second matrix sub-group SG1 of the first matrix group MG0. In case of the present embodiment, because the second row address adder 230-2 adds a value of "+256" to the input row address ADDR_R2, the memory cells selected in the matrices "8-15", "40-47", "80-87" and "112-119" accessed through the second data I/O terminal DQ1 may have the second row address ADDR_R22 which is increased by "+256" from the input row address ADDR_R2.

The third row address adder 230-3 may add a third row additive value (e.g., "+384") to the input row address ADDR_R2 and may output the result of the addition as a third row address ADDR_R23. The third row address ADDR_R23 outputted from the third row address adder 230-3 may be inputted to all of the matrices constituting the third matrix sub-group SG2. Thus, memory cells having the third row address ADDR_R23 corresponding to the changed row address may be selected in the matrices (i.e., the matrices "16-23", "48-55", "72-79" and "104-111" accessed through the third data I/O terminal DQ2) constituting the third matrix sub-group SG2 of the first matrix group MG0. In case of the present embodiment, because the third row address adder 230-3 adds a value of "+384" to the input row address ADDR_R2, the memory cells selected in the matrices "16-23", "48-55", "72-79" and "104-111" accessed through the third data I/O terminal DQ2 may have the third row address ADDR_R23 which is increased by "+384" from the input row address ADDR_R2.

The fourth row address adder 230-4 may add a fourth row additive value (e.g., "+512") to the input row address ADDR_R2 and may output the result of the addition as a fourth row address ADDR_R24. The fourth row address ADDR_R24 outputted from the fourth row address adder 230-4 may be inputted to all of the matrices constituting the fourth matrix sub-group SG3. Thus, memory cells having the fourth row address ADDR_R24 corresponding to the changed row address may be selected in the matrices (i.e., the matrices "24-31", "56-71" and "96-103" accessed through the fourth data I/O terminal DQ3) constituting the fourth matrix sub-group SG3 of the first matrix group MG0. In case of the present embodiment, because the fourth row address adder 230-4 adds a value of "+512" to the input row address ADDR_R2, the memory cells selected in the matrices "24-31", "56-71" and "96-103" accessed through the fourth data I/O terminal DQ3 may have the fourth row address ADDR_R24 which is increased by "+512" from the input row address ADDR_R2.

Next, referring to FIG. 23, the memory system according to the present embodiment may include the column address adding circuit 240. The column address adding circuit 240 may be configured to include a plurality of column address adders, for example, first to fourth column address adders 240-1, . . . and 240-4. The first to fourth column address adders 240-1, . . . and 240-4 may receive an input column address ADDR_C2 in common. The first column address adder 240-1 may add a first column additive value (e.g., "+64") to the input column address ADDR_C2 and may output the result of the addition as a first column address ADDR_C21. The first column address ADDR_C21 outputted from the first column address adder 240-1 may be inputted to all of the matrices constituting the first matrix sub-group SG0. Thus, memory cells having the first column address ADDR_C21 corresponding to the changed column address may be selected in the matrices (i.e., the matrices "0-7", "32-39", "88-95" and "120-127" accessed through the first data I/O terminal DQ0) constituting the first matrix sub-group SG0 of the first matrix group MG0. In case of the present embodiment, because the first column address adder 240-1 adds a value of "+64" to the input column address ADDR_C2, the memory cells selected in the matrices "0-7", "32-39", "88-95" and "120-127" accessed through the first data I/O terminal DQ0 may have the first column address ADDR_C21 which is increased by "+64" from the input column address ADDR_C2.

The second column address adder 240-2 may add a second column additive value (e.g., "+128") to the input column address ADDR_C2 and may output the result of the addition as a second column address ADDR_C22. The second column address ADDR_C22 outputted from the second column address adder 240-2 may be inputted to all of the matrices constituting the second matrix sub-group SG1. Thus, memory cells having the second column address ADDR_C22 corresponding to the changed column address may be selected in the matrices (i.e., the matrices "8-15", "40-47", "80-87" and "112-119" accessed through the second data I/O terminal DQ1) constituting the second matrix sub-group SG1 of the first matrix group MG0. In case of the present embodiment, because the second column address adder 240-2 adds a value of "+128" to the input column address ADDR_C2, the memory cells selected in the matrices "8-15", "40-47", "80-87" and "112-119" accessed through the second data I/O terminal DQ1 may have the second column address ADDR_C22 which is increased by "+128" from the input column address ADDR_C2.

The third column address adder 240-3 may add a third column additive value (e.g., "+192") to the input column address ADDR_C2 and may output the result of the addition as a third column address ADDR_C23. The third column address ADDR_C23 outputted from the third column address adder 240-3 may be inputted to all of the matrices constituting the third matrix sub-group SG2. Thus, memory cells having the third column address ADDR_C23 corresponding to the changed column address may be selected in the matrices (i.e., the matrices "16-23", "48-55", "72-79" and "104-111" accessed through the third data I/O terminal DQ2) constituting the third matrix sub-group SG2 of the first matrix group MG0. In case of the present embodiment, because the third column address adder 240-3 adds a value of "+192" to the input column address ADDR_C2, the memory cells selected in the matrices "16-23", "48-55", "72-79" and "104-111" accessed through the third data I/O terminal DQ2 may have the third column address ADDR_C23 which is increased by "+192" from the input column address ADDR_C2.

The fourth column address adder 240-4 may add a fourth column additive value (e.g., "+256") to the input column address ADDR_C2 and may output the result of the addition as a fourth column address ADDR_C24. The fourth column address ADDR_C24 outputted from the fourth column address adder 240-4 may be inputted to all of the matrices constituting the fourth matrix sub-group SG3. Thus, memory cells having the fourth column address ADDR_C24 corresponding to the changed column address may be selected in the matrices (i.e., the matrices "24-31", "56-71" and "96-103" accessed through the fourth data I/O terminal DQ3) constituting the fourth matrix sub-group SG3 of the first matrix group MG0. In case of the present embodiment, because the fourth column address adder 240-4 adds a value of "+256" to the input column address ADDR_C2, the memory cells selected in the matrices "24-31", "56-71" and "96-103" accessed through the fourth data I/O terminal DQ3 may have the fourth column address ADDR_C24 which is increased by "+256" from the input column address ADDR_C2.

As described above with reference to FIGS. 22 and 23, memory cells having the first row address ADDR_R21 generated by adding the first row address additive value (e.g., a value of "+128") to the input row address ADDR_R2 and the first column address ADDR_C21 generated by adding the first column address additive value (e.g., a value of "+64") to the input column address ADDR_C2 may be selected in the matrices constituting the first matrix sub-group SG0. Similarly, memory cells having the second row address ADDR_R22 generated by adding the second row address additive value (e.g., a value of "+256") to the input row address ADDR_R2 and the second column address ADDR_C22 generated by adding the second column address additive value (e.g., a value of "+128") to the input column address ADDR_C2 may be selected in the matrices constituting the second matrix sub-group SG1. Thus, the memory cells selected in the matrices constituting the second matrix sub-group SG1 may have a row address increased by "+128" and a column address increased by "+64" as compared with the memory cells selected in the matrices constituting the first matrix sub-group SG0. That is, memory cells selected in the matrices constituting an $L^{th}$ matrix sub-group may have a row address increased by "+128" and a column address increased by "+64" as compared with memory cells selected in the matrices constituting a $(L-1)^{th}$ matrix sub-group (where "L" is a natural number which is equal to or greater than two).

Figure 24:
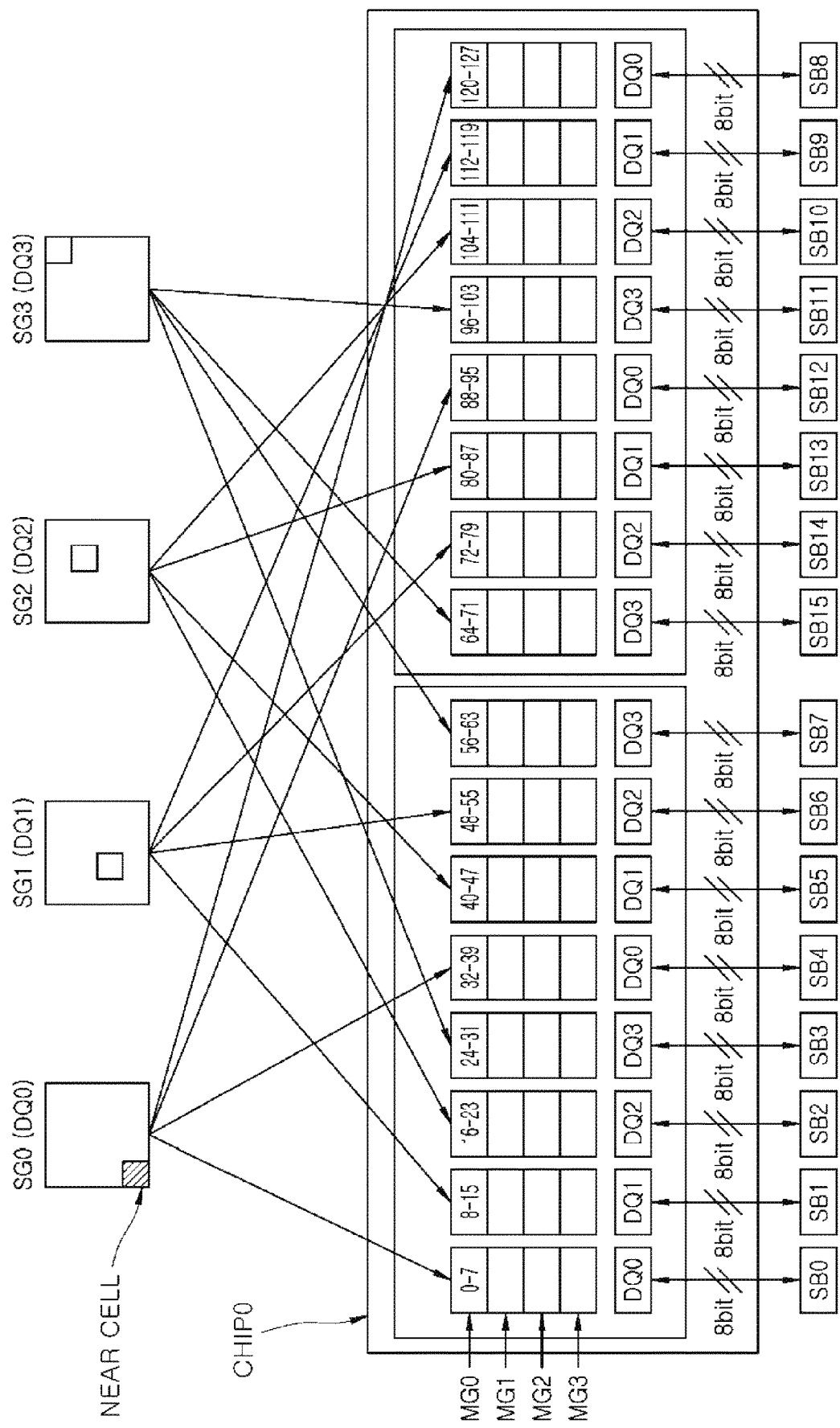
FIG. 24 is a schematic view illustrating another example of distribution of selected memory cells in matrix sub-groups of a memory chip included in a memory system according to an embodiment of the present disclosure.

FIG. 24 is a schematic view illustrating distribution of the memory cells selected in the matrix sub-groups SG0~SG3 of the bank 112 described with reference to FIGS. 15 and 16. Referring to FIG. 24, locations of memory cells accessed (i.e., selected) in the matrices may be different from each other according to the matrix sub-groups SG. For example, even though the memory cells selected in the matrices constituting the first matrix sub-group SG0 (i.e., the matrices "0-7", "32-39", "88-95" and "120-127" belonging to the first matrix sub-group SG0 of the first matrix group MG0) correspond to the near cells, the memory cells selected in the matrices belonging to the second to fourth matrix sub-groups SG1~SG3 may be located not to be the near cells. That is, because the memory cells accessed in the matrices "8-15", "40-47", "80-87" and "112-119" constituting the second matrix sub-group SG1 have the second row address ADDR_R22 increased by "+128" and the second column address ADDR_C22 increased by "+64" as compared with the memory cells accessed in the matrices "0-7", "32-39", "88-95" and "120-127" constituting the first matrix sub-group SG0, the memory cells accessed in the matrices "8-15", "40-47", "80-87" and "112-119" constituting the second matrix sub-group SG1 may be located at positions spaced apart from the near cells by a row address of "+128" and a column address of "+64". Similarly, because the memory cells accessed in the matrices "16-23", "48-55", "72-79" and "104-111" constituting the third matrix sub-group SG2 have the third row address ADDR_R23 increased by "+256" and the third column address ADDR_C23 increased by "+128" as compared with the memory cells accessed in the matrices "0-7", "32-39", "88-95" and "120-127" constituting the first matrix sub-group SG0, the memory cells accessed in the matrices "16-23", "48-55", "72-79" and "104-111" constituting the third matrix sub-group SG2 may be located at positions spaced apart from the near cells by a row address of "+256" and a column address of "+128". Although the present embodiment is described in conjunction with a case that the memory cells accessed in the matrices "0-7", "32-39", "88-95" and "120-127" constituting the first matrix sub-group SG0 correspond to the near cells, the distribution of the memory cells accessed in all of the matrix sub-groups may be substantially the same as the present embodiment even when the memory cells accessed in any one of the second to fourth matrix sub-group SG1~SG3 correspond to the near cells.

Figure 25:
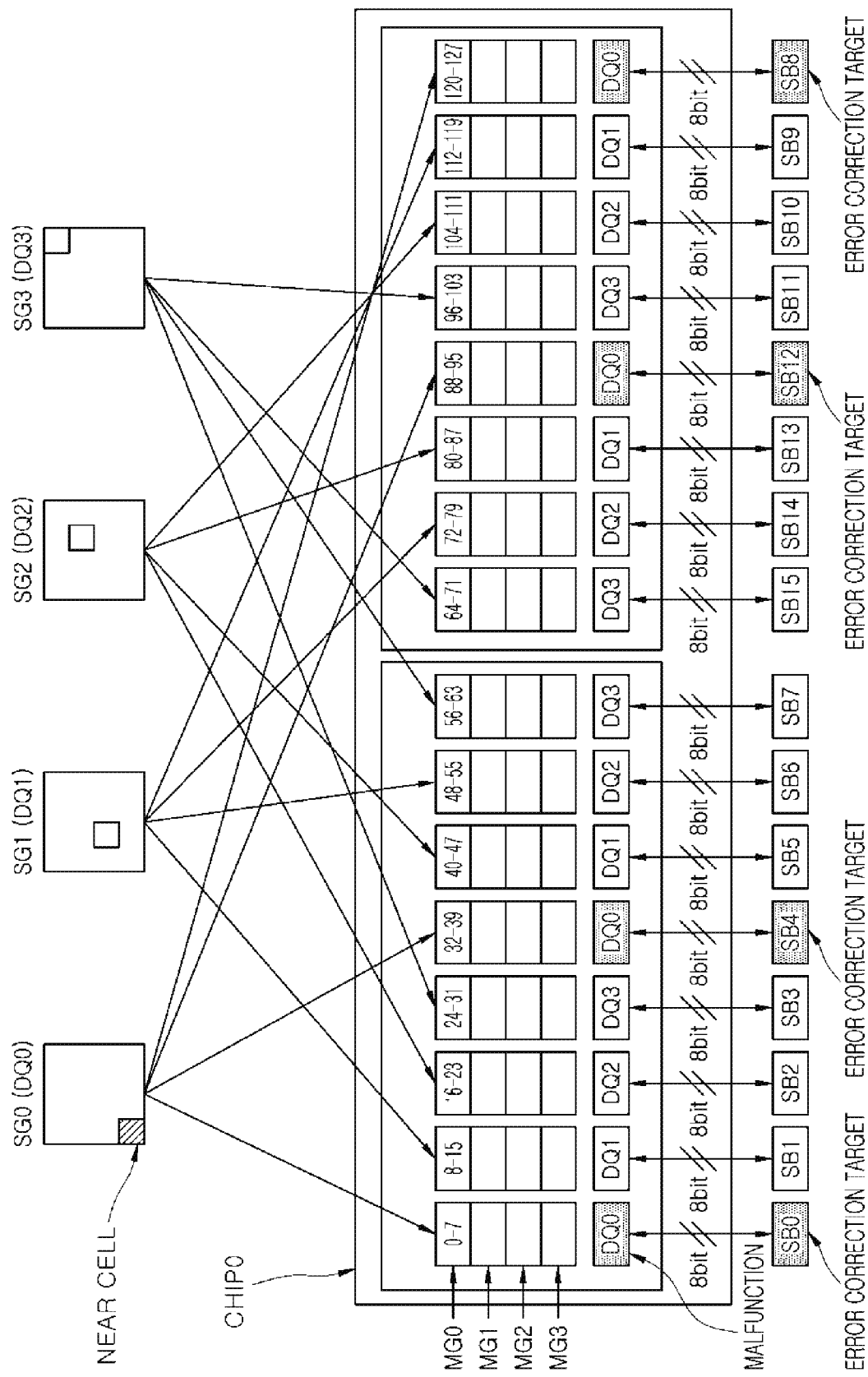
FIG. 25 is a schematic view illustrating another example of a reduced effect of the number of error correction target symbols in a memory system according to an embodiment of the present disclosure.

FIG. 25 is a schematic view illustrating a reduced effect of the number of error correction target symbols when an error occurs due to malfunction of the data I/O terminal DQ in a memory system including the bank 112 of FIG. 24. Referring to FIG. 25, when the memory cells accessed in the matrices "0-7", "32-39", "88-95" and "120-127" constituting the first matrix sub-group SG0 of the first matrix group MG0 are the near cells, the error occurrence possibility may increase during the data access to the memory cells corresponding to the near cells. In the present embodiment, it may be assumed that errors occur during the data access to the memory cells corresponding to the near cells. Even though the memory cells accessed in the matrices "0-7", "32-39", "88-95" and "120-127" constituting the first matrix sub-group SG0 through the first data I/O terminal DQ0 correspond to the near cells, the data errors may be mainly distributed in the first, fifth, ninth and thirteenth symbols SB0, SB4, SB8 and SB12 comprised of the data transmitted through the first data I/O terminal DQ0. Thus, in the event that the error correction operation is performed in units of symbols (e.g., the error correction operation is performed using an RS ECC), only the error correction for the symbols which are relatively fewer than a total amount of the near cells may be required because the near cells are mainly distributed in units of the symbols.

Meanwhile, it may be assumed that the first data I/O terminal DQ0 malfunctions, as illustrated in FIG. 25. In such a case, errors of data transmitted through the first data I/O terminal DQ0 may include both of an error occurring due to the near cells and an error occurring due to the malfunction of the first data I/O terminal DQ0. Because the memory cells of the matrices "8-31", "40-87" and "96-119" constituting the other matrix sub-groups SG1~SG3 do not correspond to the near cells, only the first, fifth, ninth and thirteenth symbols SB0, SB4, SB7, SB8 and SB12 may become error correction targets during the error correction operation. That is, because the data access to matrices of a certain matrix sub-group is executed through a certain data I/O terminal DQ, an error correction operation may be applied to only symbols comprised of data transmitted through the certain data I/O terminal DQ even though the memory cells of the matrices in the certain matrix sub-group are the near cells and the certain data I/O terminal DQ malfunctions.

The embodiments of the disclosed technology have been disclosed above for illustrative purposes. Those of ordinary skill in the art will appreciate that various modifications, additions, and substitutions are possible. While this patent document contains many specifics, these should not be construed as limitations on the scope of the present teachings or of what may be claimed, but rather as descriptions of features that may be specific to particular embodiments of particular inventions. Certain features that are described in this patent document in the context of separate embodiments can also be implemented in combination in a single embodiment. Conversely, various features that are described in the context of a single embodiment can also be implemented in multiple embodiments separately or in any suitable subcombination. Moreover, although features may be described above as acting in certain combinations and even initially claimed as such, one or more features from a claimed combination can in some cases be excised from the combination, and the claimed combination may be directed to a subcombination or variation of a subcombination.

What is claimed is:

1. A memory system comprising:
   a memory medium comprising a plurality of matrices and a plurality of data input/output (I/O) terminals;
   a row address adding circuit configured to add row address additive values to an input row address for accessing memory cells of the plurality of matrices; and
   a column address adding circuit configured to add column address additive values to an input column address for accessing memory cells of the plurality of matrices,
   wherein the plurality of matrices are configured into a plurality of matrix sub-groups, wherein each matrix sub-group is comprised of matrices accessed through a common data I/O terminal of the plurality of data I/O terminals, and
   wherein the row address additive values are different from each other according to the matrix sub-groups, and the column address additive values are different from each other according to the matrix sub-groups.

2. The memory system of claim 1, wherein each of the plurality of matrices includes:
   a plurality of word lines corresponding to a plurality of row addresses;
   a plurality of bit lines corresponding to a plurality of column addresses;
   a plurality of memory cells located at cross points of the plurality of word lines and the plurality of bit lines, respectively;
   a row decoder configured to select one of the plurality of word lines; and
   a column decoder configured to select at least one of the plurality of bit lines.

3. The memory system of claim 2, wherein one of the memory cells included in each of the plurality of matrices is selected by the row address and the column address.

4. The memory system of claim 1, wherein the plurality of matrices are simultaneously accessed.

5. The memory system of claim 1, wherein when the number of the data I/O terminals is "P" (where "P" is a natural number) and the number of the matrices is "M" (where "M" is a natural number), the number of the matrices accessed through each of the data I/O terminals is "M/P".

6. The memory system of claim 1, wherein a number of matrix sub-groups in the plurality of matrix sub-groups is equal to a number of data I/O terminals in the plurality of data I/O terminals.

7. The memory system of claim 1, wherein when the number of the data I/O terminals is "P" (where "P" is a natural number) and the number of the matrices is "M" (where "M" is a natural number), each of the plurality of matrix sub-groups includes "M/P"-number of matrices that share a common data I/O terminal of the plurality of data I/O terminals.

8. The memory system of claim 1,
   wherein a number of matrices in the plurality of matrices is "M" (where "M" is a natural number);
   wherein the "M"-number of matrices are included in one bank;
   wherein the one bank includes a left bank and a right bank; and
   wherein each of the left bank and the right bank includes "M/2"-number of matrices.

9. The memory system of claim 8,
   wherein a number of data I/O terminals in the plurality of data I/O terminals is "P" (where "P" is a natural number);
   wherein data access to the "M/2"-number of matrices in the left bank is executed in units of "M/2P"-number of matrices through each of the "P"-number of data I/O terminals; and
   wherein data access to the "M/2"-number of matrices in the right bank is executed in units of "M/2P"-number of matrices through each of the "P"-number of data I/O terminals.

10. The memory system of claim 9,
    wherein "M"-bit data outputted from or inputted to each of the left and right banks include "2P"-number of error correction code (ECC) symbols; and
    wherein each of the "2P"-number of ECC symbols is comprised of "M/2P"-bit data.

11. The memory system of claim 1, wherein the row address adding circuit comprises a plurality of row address adders that respectively add the row address additive values to the input row address which is inputted to all of the plurality of matrices.

12. The memory system of claim 11, wherein when each of the plurality of matrices comprises a cell array structure having "R"-number of row addresses (where "R" denotes a natural number) and the number of the plurality of matrix sub-groups is "J" (where "J" denotes a natural number), an increment of the row address additive values is set to be "R/J" by the plurality of row address adders.

13. The memory system of claim 1, wherein the column address adding circuit comprises a plurality of column address adders that respectively add the column address additive values to the input column address which is inputted to all of the plurality of matrices.

14. The memory system of claim 13, wherein when each of the plurality of matrices comprises a cell array structure having "C"-number of column addresses (where "C" denotes a natural number) and the number of the plurality of matrix sub-groups is "J" (where "J" denotes a natural number), an increment of the column address additive values is set to be "C/J" by the plurality of column address adders.

15. The memory system of claim 1,
wherein the plurality of matrices comprises a first matrix sub-group comprised of first matrices accessed through a first data I/O terminal among the plurality of data I/O terminals and a second matrix sub-group comprised of second matrices accessed through a second data I/O terminal among the plurality of data I/O terminals; and
wherein the row address adding circuit comprises:
a first row address adder configured to add a first row address additive value to the input row address to output the result of the addition to the first matrices of the first matrix sub-group; and
a second row address adder configured to add a second row address additive value to the input row address to output the result of the addition to the second matrices of the second matrix sub-group.

16. The memory system of claim 15, wherein the second row address additive value is greater than the first row address additive value.

17. The memory system of claim 1,
wherein the plurality of matrices comprise a first matrix sub-group comprised of first matrices accessed through a first data I/O terminal among the plurality of data I/O terminals and a second matrix sub-group comprised of second matrices accessed through a second data I/O terminal among the plurality of data I/O terminals; and
wherein the column address adding circuit comprises:
a first column address adder configured to add a first column address additive value to the input column address to output the result of the addition to the first matrices of the first matrix sub-group; and
a second column address adder configured to add a second column address additive value to the input column address to output the result of the addition to the second matrices of the second matrix sub-group.

18. The memory system of claim 17, wherein the second column address additive value is greater than the first column address additive value.

19. The memory system of claim 1, wherein locations of memory cells selected by row addresses generated by adding the row address additive values and column addresses generated by adding the column address additive values in the matrices constituting one of the plurality of matrix sub-groups are different from locations of memory cells selected by row addresses generated by adding the row address additive values and column addresses generated by adding the column address additive values in the matrices constituting the remaining ones of the plurality of matrix sub-groups.

20. The memory system of claim 1,
wherein the memory medium includes a plurality of memory chips;
wherein each of the plurality of memory chips includes a plurality of banks;
wherein each of the plurality of banks includes a plurality of matrices; and
wherein for all of the plurality memory chips, the matrices constituting a selected bank from the plurality of banks are simultaneously accessed.

* * * * *